United States Patent
Yang et al.

(10) Patent No.: US 7,253,461 B2
(45) Date of Patent: Aug. 7, 2007

(54) SNAPSHOT CMOS IMAGE SENSOR WITH HIGH SHUTTER REJECTION RATIO

(75) Inventors: Guang Yang, Annandale, NJ (US); Taner Dosluoglu, New York, NY (US)

(73) Assignee: Dialog Imaging Systems GmbH, Kirchheim, Teck-Nabern (DE)

( * ) Notice: Subject to any disclaimer, the term of this patent is extended or adjusted under 35 U.S.C. 154(b) by 73 days.

(21) Appl. No.: 11/139,743

(22) Filed: May 27, 2005

(65) Prior Publication Data

US 2006/0267053 A1 Nov. 30, 2006

(51) Int. Cl.
*H01L 31/062* (2006.01)

(52) U.S. Cl. ............... 257/292; 257/213; 257/288; 257/290; 257/E27.133; 438/48; 438/57; 438/73

(58) Field of Classification Search ............... None
See application file for complete search history.

(56) References Cited

U.S. PATENT DOCUMENTS

| | | | |
|---|---|---|---|
| 6,069,376 A * | 5/2000 | Merrill ............... 257/291 |
| 6,218,691 B1 | 4/2001 | Chung et al. ............... 257/290 |
| 6,326,230 B1 | 12/2001 | Pain et al. ............... 438/57 |
| 6,403,998 B1 | 6/2002 | Inoue ............... 257/292 |
| 6,521,920 B2 | 2/2003 | Abe ............... 257/223 |
| 6,737,626 B1 | 5/2004 | Bidermann et al. ....... 250/208.1 |
| 6,839,452 B1 | 1/2005 | Yang et al. ............... 382/103 |
| 6,885,047 B2 | 4/2005 | Shinohara et al. ........... 257/292 |
| 2004/0103095 A1 * | 5/2004 | Matsugu et al. ............... 707/6 |
| 2004/0222449 A1 * | 11/2004 | Koyama ............... 257/292 |

OTHER PUBLICATIONS

"A Snap-Shot CMOS Active Pixel Imager for Low-Noise, High-Speed Imaging," Yang et al., Tech, Digest, Int'l Elec Devices Meetting, Dec. 1998, pp. 45-48.
"CMOS Difference Imagers with Charge Leakage Compensation and Sum Output," Pain et al., IEEE Workshop on Charge-Coupled Devices and Advanced Image Sensors, Jun. 2001, pp. 125-138, 2000.
"CMOS Imager with Charge-Leakage Compensated Frame Difference and Sum Output," Pain et al., The 2001 IEEE Int'l Symp. on Circuits and Systems, May 2001, vol. 5, pp. 223-226.

(Continued)

*Primary Examiner*—Sue A. Purvis
*Assistant Examiner*—Kevin Quinto
(74) *Attorney, Agent, or Firm*—Saile Ackerman LLC; Stephen B. Ackerman; Billy Knowles

(57) ABSTRACT

A pixel image sensor has an isolation barrier and diffusion well connected to a biasing voltage to prevent substrate charge leakage caused by photoelectrons generated in the substrate beneath a photon sensing area of the pixel image sensor from drifting to a storage node. An opaque metallic silicide layer is deposited on and a metal shield is fabricated above the storage node and storage node control transistor switches to prevent light from impinging on the storage node and storage node control transistor switches and thus preventing generation of photoelectrons at the storage node and storage node control transistor switches. A guard ring surrounds the photo sensing area, the storage node, and the storage node control transistor switches and is in contact with the biasing voltage and reduces cross-talk from photoelectrons drifting from adjacent image sensors.

41 Claims, 15 Drawing Sheets

OTHER PUBLICATIONS

"CMOS Image Sensor with Nmos-Only Global Shutter and Enhanced Responsivity," Wang et al., IEEE Trans. on Elec. Devices, Jan. 2003, vol. 50, Issue:1, pp. 57-62.

2005 IEEE Workshop on CCD and AIS, Jun. 9-11, 2005 Karuizawa, Nagano, Japan (pp. 161-164), "Ultra High Light Shutter Rejection Ratio Snapshot Pixel Image Sensor ASIC for Pattern Recognition", Guang Yang et al.

Actuator 2004, 9th Int'l Conf. an Now Actuators, Jun. 14-16, 2004, Breman, Germany, pp. 491-494, "Micromotor Based on Film Permanent Magnets", P. Meneroud et al.

"Ultra High Light Shutter Rejection Ratio Snapshot Pixel Image Sensor ASIC for Pattern Recognition", Yang & Dosluoglu, Proceeding of the 2005 IEEE Workshop on CCD and AIS, Jun. 9-11, 2005, Karuizawa, Nagano, Japan, pp.:161-164.

* cited by examiner

FIG. 1 – Prior Art

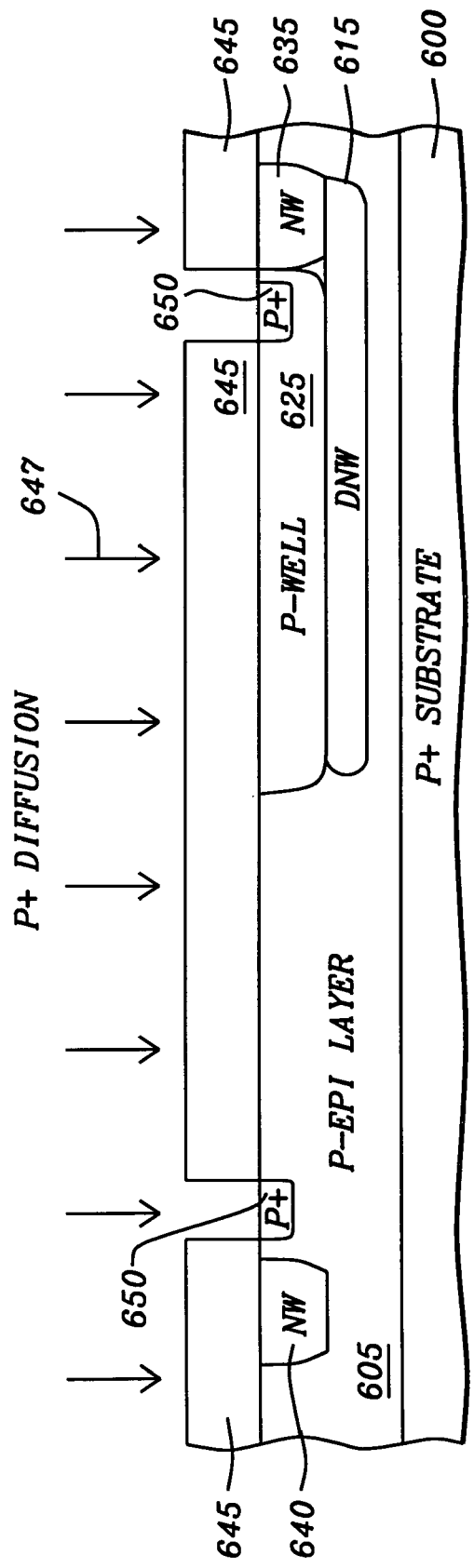
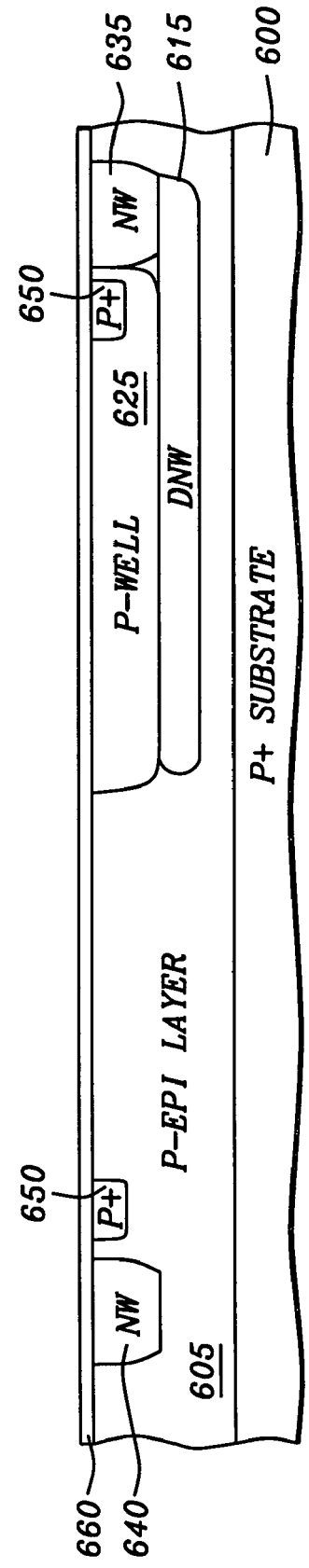
FIG. 7e
FIG. 7f

SNAPSHOT CMOS IMAGE SENSOR WITH HIGH SHUTTER REJECTION RATIO

BACKGROUND OF THE INVENTION

1. Field of the Invention

The present invention relates to solid-state image sensing devices, methods for fabricating solid state image sensing devices and a pattern recognition system using the same.

2. Description of Related Art

Integrated circuit image sensors are finding applications in a wide variety of fields, including machine vision, robotics, guidance and navigation, automotive applications, and consumer products such as digital camera and video recorders. Imaging circuits typically include a two dimensional array of photo sensors. Each photo sensor includes one picture element (pixel) of the image. Light energy emitted or reflected from an object impinges upon the array of photo sensors. The light energy is converted by the photo sensors to an electrical signal. Imaging circuitry scans the individual photo sensors to readout the electrical signals. The electrical signals of the image are processed by external circuitry for subsequent display.

Modern metal oxide semiconductor (MOS) design and processing techniques have been developed that provide for the capture of light as charge and the transporting of that charge within active pixel sensors and other structures so as to be accomplished with almost perfect efficiency and accuracy.

One class of solid-state image sensors includes an array of active pixel sensors (APS). An APS is a light sensing device with sensing circuitry inside each pixel. Each active pixel sensor includes a sensing element formed in a semiconductor substrate and capable of converting photons of light into electronic signals. As the photons of light strike the surface of a photoactive region of the solid-state image sensors, free charge carriers are generated and collected. Once collected the charge carriers, often referred to as a charge packets or photoelectrons, are transferred to output circuitry for processing.

An active pixel sensor also includes one or more active transistors within the pixel itself. The active transistors amplify and buffer the signals generated by the light sensing element to convert the photoelectron to an electronic signal prior to transferring the signal to a common conductor that conducts the signals to an output node.

Active pixel sensor devices are fabricated using processes that are consistent with complementary metal oxide semiconductor (CMOS) processes. Using standard CMOS processes allows many signal processing functions and operation controls to be integrated with an array of active pixel sensors on a single integrated circuit chip.

Refer now to FIG. 1 for a more detailed discussion of a photogate active pixel image sensor of the prior art. A substrate 5 heavily doped with a P-type impurity has its surface further doped with a complementary impurity to create a lightly doped P-type epitaxial layer 10. A P-type material is diffused into the surface of the substrate 5 to form the contact diffusions 12 for the P-type epitaxial layer 10. An N-type material is heavily diffused into the surface of the substrate 5 to form the $N^+$ source/drain regions 20 and 40 and the floating diffusion 35. A gate insulator or thin oxide 95 is placed on the surface of the substrate 5 and polycrystalline silicon is formed on the surface to form the photogate 45 and the gates 25 and 35. The $N^+$ source/drain region 20, the floating diffusion 35, and the gate 25 are a transfer gate switch and the floating diffusion 35, the $N^+$ source/drain regions 40, and the gate 35 form the reset gate switch of the active pixel sensor.

The photogate 45 is connected to a photogate biasing signal PG 50. The gate 25 of the transfer gate switch is connected to a transfer gating signals T_GT 65 and the gate 35 of the reset gate switch is connected to the pixel reset signal PIX_RST 70. The $N^+$ source/drain region 40 is connected to a power supply voltage source VDD. The floating diffusion 30 is connected to the gate of the CMOS transistor 85. The drain of the CMOS transistor 85 is connected to the power supply voltage source VDD and the emitter of the CMOS transistor 85 is connected to the drain of the CMOS transistor 80. The gate of the CMOS transistor 80 is connected to the row select signal 75. The CMOS transistor 85 acts as a source follower to buffer the electrical signal created by the photoelectron charge collected in the floating diffusion 30.

When the photogate 45 is activated to a voltage of approximately 4.0V, the hole majority carriers within the p-type epitaxial layer 10 are depleted in the region beneath the photogate 45 to form the depletion layer 55. The photons that impinge upon the photogate 45 are converted to photoelectrons and collected in the depletion layer 55. At the completion of an integration of the collection of the photoelectrons, the transfer gate 25 is activated to turn on the transfer gate switch to transfer the collected photoelectrons to the storage node of the floating diffusion 30. When the collected photoelectrons are retained at the floating diffusion 30 the row select signal is activated to turn on the transistor 80 to gate the pixel output electrical signal PIX_OUT 90 to external circuitry for processing and display. The amplitude of pixel output electrical signal PIX_OUT 90 is indicative of the intensity of the light energy hv or the number of photons 60 absorbed by the photogate 45. Once the pixel output electrical signal PIX_OUT 90 is read out the pixel reset signal is activated to turn on the reset gate switch and the depletion layer 55 and the storage node 30 are emptied of the photoelectrons.

As structured, some of the light energy hv 60 impinges upon the transfer gate switch and the reset gate switch and are converted to stray photoelectrons that collect in the floating diffusion 30. Some of the photoelectrons 62 may drift from the depletion layer 55. Some of these photoelectrons 62 may drift to other pixels in relatively close proximity. Other photoelectrons 63 from the depletion region 55 will drift to the floating diffusion 30 and photoelectrons 64 will drift to the floating diffusion 30 from nearby pixels. All of these stray photoelectrons 62, 63, and 64 cause noise currents that interfere with the detection of the correct values of light intensity and cause distortion such as blooming and smearing of the image.

Active pixel sensor arrays may be operated in a read-reset mode with a row at a time being read out. This technique has minimum integration time to collect the photons and minimum time for generating a frame, however it may have motion artifacts due to non-simultaneous exposure.

A second type of operation of a CMOS active pixel sensor array is a block access mode. A block of pixels adjacent pixels are readout. This too has minimum integration time for a full block read out. Control for this type of read out is complicated Typically, a CMOS active pixel sensor array is operated in a rolling shutter mode in which each row of the array is exposed at different instants of time. The non-simultaneous exposure of the pixels can lead to image distortion, for example, when there is relative motion between the imager and the image that is to be captured. Furthermore, although the exposure time generally is defined by the duration for which the photogate is turned on, floating diffusion regions can continue to collect photoelectrons even after the photogate is turned off. Transfer of such unwanted charges into the sense node can result in image distortion and excess noise. Furthermore, the distortions tend to become more pronounced as the exposure time is reduced.

An alternative to the rolling shutter mode of operation is the snapshot mode with single simultaneous conversion of the photons to the photoelectrons and transfer of the photoelectrons to the floating diffusion storage node. Each pixel is read out one at-a-time readout. Since all pixels are exposed essentially simultaneously, the motion artifact is minimized. However, relatively long integration times (10 msec) precludes the capture of high velocity moving objects without blurring or the motion artifact.

"A Snap-Shot CMOS Active Pixel Imager for Low-Noise, High-Speed Imaging", Yang, et al., Technical Digest., International Electron Devices Meeting, December 1998, pp.: 45-48, presents the design and performance of a 128×128 snap-shot imager implemented in a standard single-poly CMOS technology. The pixel design and clocking scheme allows the imager to provide high-quality images without motion artifacts at high shutter speeds (<75 µsec, exposure), with low noise (<5 e⁻), immeasurable image lag, and excellent blooming protection.

"CMOS Difference Imagers with Charge-Leakage Compensation and Sum Output", Seshadri, et al., IEEE Workshop on Charge-Coupled Devices and Advanced Image Sensors, June 2001, pp. 125 128, 2001, and "CMOS Imager with Charge-Leakage Compensated Frame Difference and Sum Output", Pain, et al., The 2001 IEEE International Symposium on Circuits and Systems, May 2001, Vol. 5, pp.: 223-226 present a new technique for implementing a low-power CMOS imager with simultaneous on-chip computation of the difference and sum of two successive frames. The imager uses an unbalanced differential signal chain to provide 17 fold reduction in leakage error in the frame-difference output.

"CMOS Image Sensor with NMOS-Only Global Shutter and Enhanced Responsivity", Wany, et al., IEEE Transactions on Electron Devices, January 2003, Vol. 50, Issue: 1, pp.: 57-62, presents an NMOS-only pixel with a global shutter and subthreshold operation of the NMOS sample-and-hold transistor to increase optical responsivity by a factor of five to nine µV/photon, including fill factor. Wany et al further describes use of separate wells in the pixel to isolate the storage node from the photodiode showed good shutter efficiency.

U.S. Pat. No. 6,885,047 (Shinohara, et al.) describes a solid-state image sensing device. Each pixel of the image sensing device has a photodiode, a first transistor, and a second transistor. A potential barrier is provided under the drain region of the first transistor and the source region and/or the drain region of the second transistor.

U.S. Pat. No. 6,839,452 (Yang, et al.) teaches a dynamically re-configurable CMOS imagers for an active vision system. The CMOS imager includes a pixel array, at least one multi-resolution window operation circuit, and a pixel averaging circuit. The pixel array has an array of pixels configured to receive light signals from an image having at least one tracking target. The multi-resolution window operation circuits are configured to process the image. Each of the multi-resolution window operation circuits processes each tracking target within a particular multi-resolution window. The pixel averaging circuit is configured to sample and average pixels within the particular multi-resolution window.

U.S. Pat. No. 6,737,626 (Bidermann, et al.) teaches an integrated image sensor having a conditioned top silicon oxide layer and/or one or more additional insulating layers/structures to reduce optical and/or electrical noise. The image sensor has one or more insulating structures formed on the substrate and configured to inhibit the flow of electricity between a photoelement and its associated circuitry and/or the pixel and an adjacent pixel in the array.

U.S. Pat. No. 6,521,920 (Abe) provides a solid state image sensor with a primary first-conductivity-type semiconductor region which serves as a charge storage region of a photo-sensing area and a secondary first-conductivity-type semiconductor region for enlarging a charge collecting region of the photo-sensing area.

U.S. Pat. No. 6,403,998 (Inoue) describes solid-state image sensor having a first P-well area is provided in a surface portion of an n type silicon substrate and a second P-well area is selectively provided in the surface portion of the first P-well area. The second P-well area is higher in p type impurity concentration than the first P-well area. The photoelectric conversion section is formed in the first P-well area and the signal scanning circuit section is formed in the second P-well area.

U.S. Pat. No. 6,326,230 (Pain, et al.) describes high speed CMOS imager with motion artifact supression and anti-blooming. Each pixel of the CMOS imager includes a photoactive region in the semiconductor substrate, a sense node, and a power supply node. A transfer gate is disposed above the surface of the semiconductor substrate. A bias signal applied to the transfer gate sets a potential in a region of the semiconductor substrate between the photoactive region and the sense node for transfer of photoelectrons to the sense node. A reset gate is disposed near the surface of the semiconductor substrate between the photoactive region and the power supply node. A reset signal on the reset gate sets a potential in a region of the semiconductor substrate between the photoactive region and the power supply node for clearing the photoelectrons from the photoactive region after read out of the electrical signal of an image without passing through the sense node.

U.S. Pat. No. 6,218,691 (Chung, et al.) presents a unit pixel array having a plurality of unit pixels formed on an N-type buried layer placed on a semiconductor substrate to isolate the unit pixel from the P-type epitaxial layer of a peripheral circuit.

SUMMARY OF THE INVENTION

An object of this invention is to provide a pixel image sensor that has a high shutter rejection ratio.

Another object of this invention is to provide a pixel image sensor that prevents substrate charge leakage to a storage node of the pixel image sensor Further, another object of this invention is to provide a pixel image sensor that prevents generation of photoelectrons within the storage node and storage node control transistor switches of the pixel image sensor;

Even further, another object of this invention is to provide a pixel image sensor that prevents substrate charge leakage of photoelectrons from pixel image sensor adjacent to the pixel image sensor.

To accomplish at least one of these objects, a pixel image sensor is fabricated on a substrate with an isolation barrier and diffusion well connected to a biasing voltage to prevent substrate charge leakage caused by photoelectrons generated in the substrate beneath a photon sensing area of the pixel image sensor from drifting to a storage node. The isolation barrier is placed at a relatively great depth from a surface of the substrate and beneath the storage node and storage node control transistor switches of the pixel image sensor. The diffusion well is placed in the surface of the substrate to contact the isolation barrier and connected to a first biasing voltage to channel the photoelectrons away from the storage node.

The pixel image sensor further includes a metal shield fabricated above the storage node and storage node control transistor switches. The metal shield prevents light from impinging on the storage node and storage node control transistor switches and thus prevents generation of photoelectrons at the storage node and storage node control transistor switches.

The pixel image sensor has a metallic silicide layer that is in contact with the storage node and source/drain regions of the storage node control transistor switches. The metallic silicide layer is opaque and prevents light impinging on the storage node and storage node control transistor switches from generation of photoelectrons at the storage node and storage node control transistor switches.

A guard ring is included in the pixel image sensor and surrounds the photo sensing area, the storage node, and the storage node control transistor switches. The guard ring is in contact with the first biasing voltage and reduces cross-talk from photoelectrons drifting from adjacent image sensors in an array of pixel image sensor formed on the substrate.

The first biasing voltage is the power supply voltage source connected such that the guard ring drains the photoelectrons that drift toward the guard ring. Further, the power supply voltage source, as connected to the isolation barrier, drains the photoelectrons that drift toward the isolation barrier.

The pixel image sensor is fabricated in an epitaxial layer of the substrate. The epitaxial layer is doped with an impurity of a first conductivity type and the isolation barrier is formed from diffusion of an impurity of a second conductivity type to the relatively great depth. An isolation well is fabricated by diffusion of the impurity of the first type to a depth less than the relatively great depth. The storage node and storage node control transistor switches are formed within the isolation well.

The metal shield extends at least approximately 2.0 µm beyond an area defined by the storage node and storage node control transistor switches. Further, the metal shield is a highest level wiring layer fabricated on the surface of the substrate, wherein interconnections for the snapshot active pixel image sensor are placed on lower wiring levels fabricated on the surface of the substrate.

BRIEF DESCRIPTION OF THE DRAWINGS

FIGS. 7a-7j are cross sectional views of a substrate in the process of fabrication of a snapshot photogate CMOS active pixel sensor of this invention.

DETAILED DESCRIPTION OF THE INVENTION

Fast moving pattern recognition systems, such as machine vision and robot control system require arrays of snapshot CMOS active pixel image sensors with an ultra high light shutter rejection ratio for detecting moving objects without motion artifacts. Light leakage to the storage node must be minimized to provide snapshot images without motion artifacts.

Figure 1:
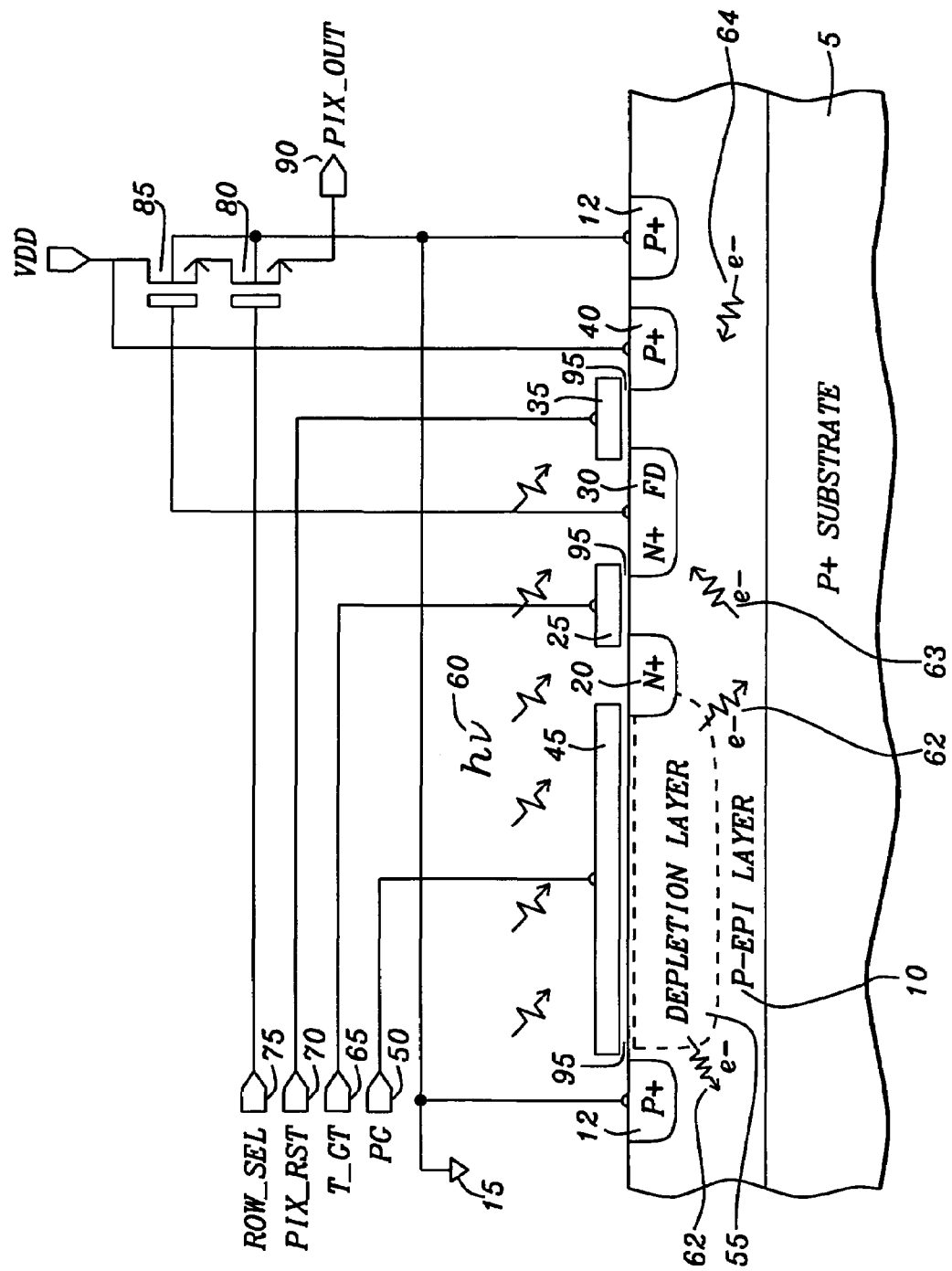
FIG. 1 is cross sectional view of a photogate CMOS active pixel image sensor of the prior art.
Figure 2:
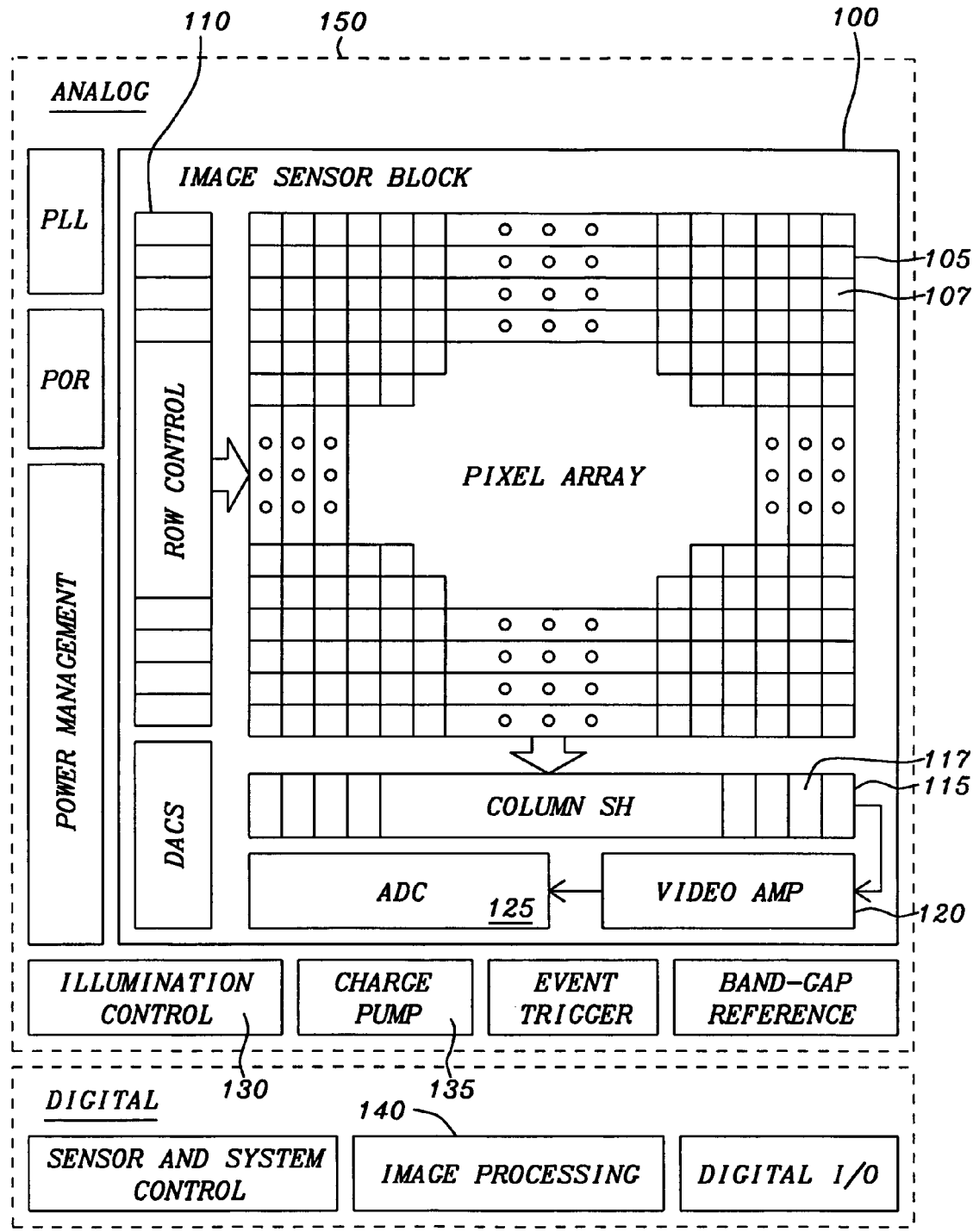
FIG. 2 is a diagram of an image processing application specific integrated circuit containing an array of snapshot photogate CMOS active pixel image sensors.

Refer to FIG. 2 for a discussion of an image processing application specific integrated circuit 150. The image processing application specific integrated circuit contains an image sensor 100. The image sensor 100 has an array 105 of snapshot photogate CMOS active pixel image sensors, row control circuitry 110, column sample and hold circuitry 115, a video amplifier 120, and an analog-to-digital converter 125.

The image processing application specific integrated circuit 150 has photogate active pixel image sensor array 105 in a preferred implementation is arranged an array of 100× 100 active pixels for pattern recognition. A few rows of dark pixels for auto offset correction. An illumination source of the system is controlled by an illumination control circuit 130 with an on chip charge pump 135 as power supply. To suppress motion artifacts and minimize the system power consumption, the illumination turned ON during the very short integration time. However, in the particular application for which this image processing application specific integrated circuit 150 is intended, the background illumination is expected to vary several orders of magnitude. Thus, snapshot operation of image sensor with minimum charge leakage is required.

Figure 3:
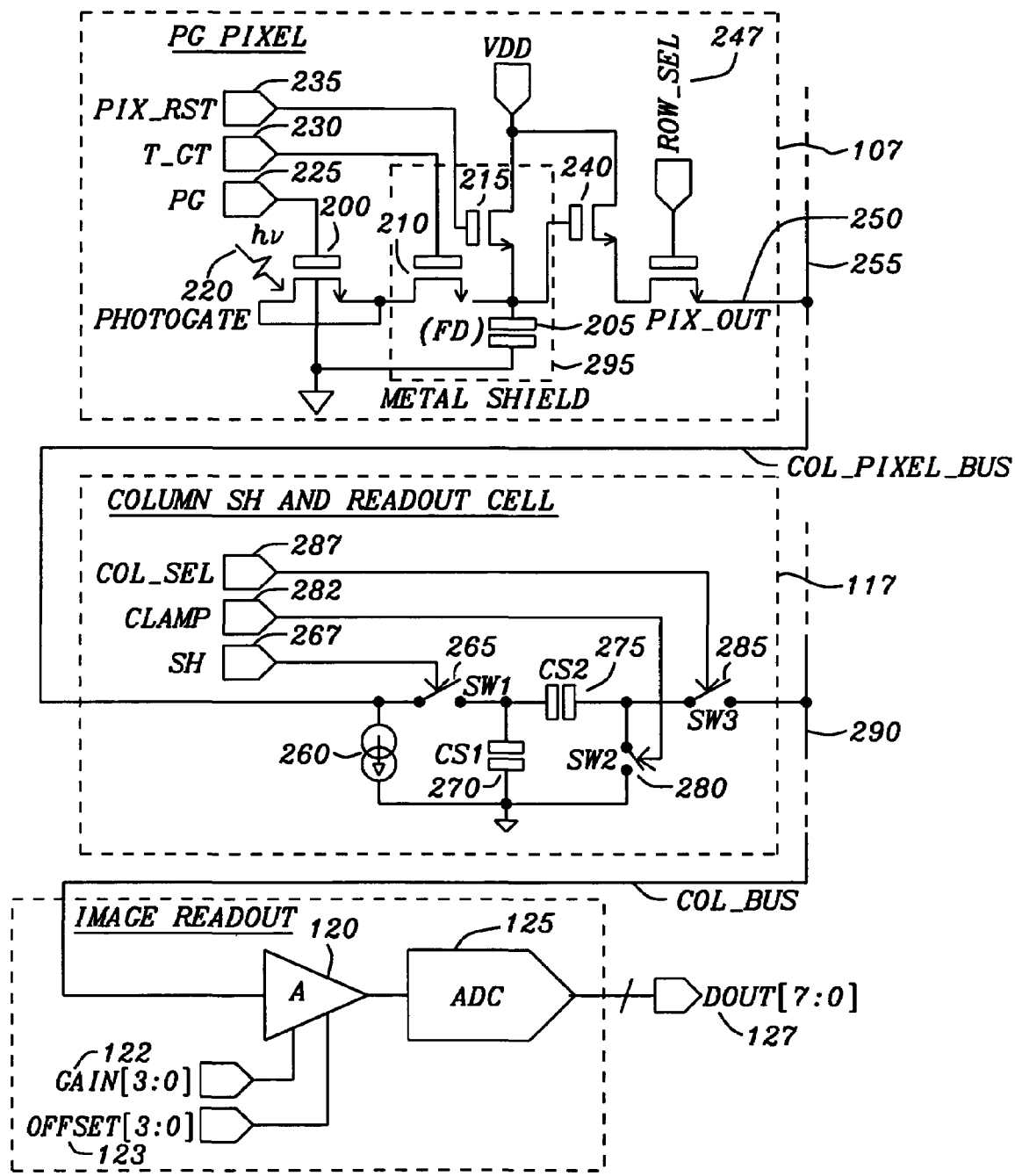
FIG. 3 is schematic diagram of a photo detection, photo conversion, and image readout path of a snapshot photogate CMOS active pixel image sensor.

The structure of each column of photogate CMOS active pixel image sensors 107 is shown in FIG. 3. The photogate CMOS active pixel image sensors 107 has a photogate 200, a floating diffusion storage node 205, a transfer gate switch 210, and a reset gate switch 215. The photogate receives the photons of light 220 for conversion to photoelectrons that are collected in the epitaxial layer under the photogate 200 when it biased by the photogate activation signal PG 225. The photoelectrons are transferred to floating diffusion storage node 205 when the transfer gate switch 210 is activated. The number of electrons stored at the floating diffusion storage node 205 is indicative of the intensity of the light energy 220 impinging on the photogate 200. Upon completion of the transfer of the photoelectrons to the floating diffusion storage node 205, the transfer gate switch 210 is deactivated and the voltage potential of the collected and retained photoelectrons is applied to the gate of the CMOS transistor 240. When the row select signal 247 is activated the CMOS transistor 245, the pixel output electrical signal PIX_OUT 250 is transferred through the column pixel bus 255 to one column sample and hold readout cell 117.

The column sample and hold circuit 117 combines the column pixel row operation (pixel reset, row select) and the column operation (the photo generation, photo sensing). The clamp signal activates the switch $SW_2$ 280 to place the capacitors of CS1 270 and CS2 280 in parallel for charging during the readout of the pixel output electrical signal PIX_OUT 250. The switch $SW_2$ is the deactivated during the pixel reset time to provide the differential output signal. This combination causes the output voltage of the sample and hold circuit 117 to be equal to the differential voltage of pixel reset level and photo conversion electrical signal level, i.e., $V_{out}=V_{rst}-V_{sig}$. During the pixel readout, switch $SW_3$ 285 controlled by column select signal COL_SEL 287 transfers the differential voltage through the column bus COL_BUS 290 to the video amplifier 120 that applies the gain factor 122 and offset correction factor 123 to the output signal. The output of video amplifier 120 is the analog output that is digitized by an analog-to-digital converter 125. The output of the analog-to-digital converter 125 is the digital data word 127 that is transferred to the image processor 140 of FIG. 2.

The photogate active pixel image sensor array 105 utilizes five transistor photogate CMOS active pixel image sensor with 20 μm×20-μm pitch for adequate modulation transfer function (MTF) and quantum efficiency (QE) in near infrared (IR) illumination. In addition to near IR image quality requirement, the most critical performance parameter is the shutter rejection ratio (SRR). The ratio of readout time compared to the shortest integration time requirement of 20 μsec presents a challenge to achieve 50,000× (94 dB) SRR under bright ambient illumination during readout. A snapshot photogate CMOS active pixel image sensor of the prior art with snapshot operation is not able to achieve such a high SRR due to light leakage and substrate charge leakage to the pixel charge storage node during the readout time. Light leakage is due to the stray light finding its way to the storage node if the storage node is not fully covered by a metal shield. The light leakage can-be minimized by a metal shield 295 of this invention that covers a silicided floating diffusion storage node 205. Substrate charge leakage is caused by the photoelectrons generated in the substrate beneath the photon sensing area drifting to the floating diffusion storage node 205. A deep N-well charge isolation layer of this invention is connected to the guard ring and is placed under the storage node 205 to prevent the charge leaking to the storage node.

Figure 5:
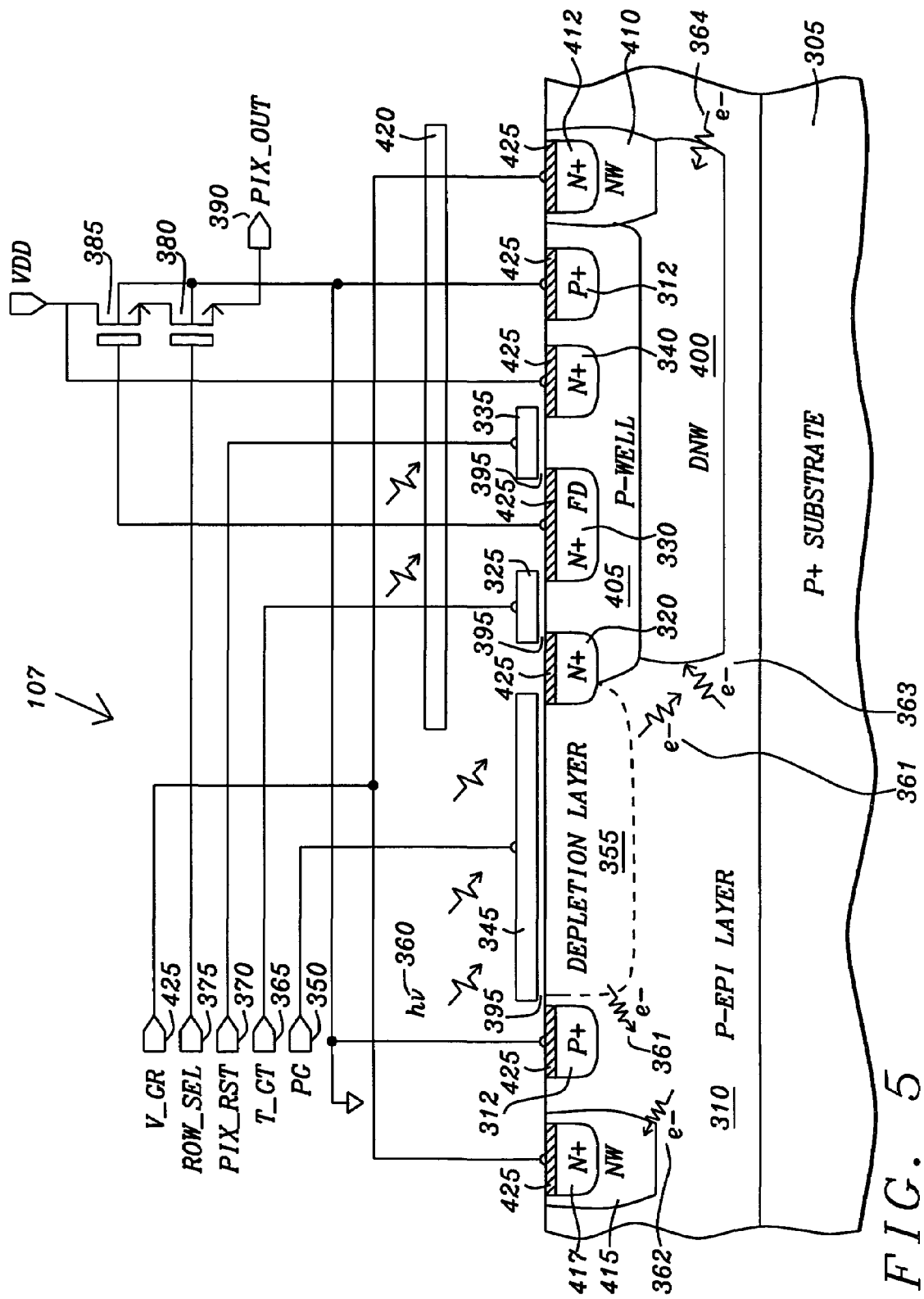
FIG. 5 is cross sectional view of a snapshot photogate CMOS active pixel image sensor of this invention.

Refer now to FIG. 5 for a discussion structure of the ultra high shutter rejection ratio snapshot photogate active pixel image sensor of this invention. A substrate 305 heavily doped with a P-type impurity has its surface further doped with a complementary impurity to create a lightly doped P-type epitaxial layer 310. A P-type material is diffused into the surface of the substrate 305 to form the contact diffusions 312 for the P-type epitaxial layer 310. An N-type material is deeply diffused into the surface of the substrate 305 to a relatively great depth in the area into which the transfer gate switch and the reset gate switch are to be formed to form the deep N-well isolation barrier 400. The N-type material is then diffused into the surface of the substrate 305 to contact the deep N-well 400 and form the diffusion well 410. With this same N-type diffusion, an N-type guard ring diffusion 415 is formed to circumscribe the area of the snapshot photogate active pixel image sensor 107. The N-type guard ring diffusion 415 is connected to the guard ring biasing voltage V_GR 425. Similarly, the deep N-well isolation barrier 410 is connected through the diffusion well to the guard ring biasing voltage V_GR 425. The guard ring biasing voltage V_GR 425 is normally set to the voltage level of the power supply voltage source VDD.

The P-type material is diffused to a lightly doped impurity level in the surface above the isolation barrier 400 to form the P-type isolation well 405. The P-type material is then diffused into the substrate to a heavily doped impurity level to make the P-type contact diffusions 312. An N-type material is heavily diffused into the surface of the substrate 305 to form the N⁺ source/drain regions 320 and 340, the floating diffusion 335, and the N⁺ contact diffusions 412 and 417.

A metallic silicide layer 425 is placed on the surface of the contact diffusions 312, the N⁺ source/drain regions 320 and 340, the floating diffusion 335, and the N⁺ contact diffusions 412 and 417 to form the low resistance contacts for the interconnects. The metallic suicide layer 425 additionally is opaque and when placed on the N⁺ source/drain regions 320 and 340 of the transfer switch gate and the reset gate switch, and the floating diffusion 335 of the storage node prevents light impinging on the transfer switch gate and the reset gate switch from generating photoelectrons at the transfer switch gate and the reset gate switch.

A gate insulator or thin oxide 395 is placed on the surface of the substrate 305 and polycrystalline silicon is formed on the surface to form the photogate 345 and the gates 325 and 335. The N⁺ source/drain region 320, the floating diffusion 335, and the gate 325 form the transfer gate switch and the floating diffusion 335, the N⁺ source/drain regions 340, and the gate 335 form the reset gate switch of the active pixel sensor.

The photogate 345 is connected to a photogate biasing signal PG 350. The gate 325 of the transfer gate switch is connected to a transfer gating signals T_GT 365 and the gate 335 of the reset gate switch is connected to the pixel reset signal PIX_RST 370. The N⁺ source/drain region 340 is connected to a power supply voltage source VDD. The floating diffusion 330 is connected to the gate of the CMOS transistor 385. The drain of the CMOS transistor 385 is connected to the power supply voltage source VDD and the emitter of the CMOS transistor 385 is connected to the drain of the CMOS transistor 380. The gate of the CMOS transistor 380 is connected to the row select signal 375. The CMOS transistor 385 acts as a source follower to buffer the electrical signal created by the photoelectron charge collected in the floating diffusion 330.

When the photogate 345 is activated to a voltage of approximately 4.0V, the hole majority carriers within the p-type epitaxial layer 310 are depleted in the region beneath the photogate 345 to form the depletion layer 355. The photons that impinge upon the photogate 345 are converted to photoelectrons and collected in the depletion layer 355. At the completion of an integration of the collection of the photoelectrons, the transfer gate 325 is activated to turn on the transfer gate switch to transfer the collected photoelectrons to the storage node of the floating diffusion 330. When the collected photoelectrons are retained at the floating diffusion 330 the row select signal is activated to turn on the transistor 380 to gate the pixel output electrical signal PIX_OUT 390 to external circuitry for processing and display. The amplitude of pixel output electrical signal PIX_OUT 390 is indicative of the intensity of the light energy or the number of photons 360 absorbed by the photogate 345. Once the pixel output electrical signal PIX_OUT 390 is read out the pixel reset signal is activated to turn on the reset gate switch and the depletion layer 355 and the storage node 330 are emptied of the photoelectrons.

The metal shield prevents the light energy 360 from impinging upon the transfer gate switch and the reset gate switch and is not converted to stray photoelectrons that collect in the floating diffusion 330. The metal shield must sufficiently large to overlap the storage node floating diffusion 330, the transfer gate switch, and the reset gate switch. In the preferred embodiment, the metal shield 360 overlaps beyond the storage node floating diffusion 330, the transfer gate switch, and the reset gate switch by 2.0 µm.

Some of the photoelectrons 361 will drift from the depletion layer 355. Those photoelectrons 362 that are in close proximity to the guard ring diffusion 415 are captured by the guard ring 415. Others of the photoelectrons 363 are captured by the deep N-well isolation barrier 400 and transferred to the guard ring biasing voltage V_GR 425. Further, any photoelectrons 364 that may have not been captured by the guard ring biasing voltage V_GR 425 of adjacent photogate CMOS active pixel image sensors 107 are captured by the N-well isolation barrier 400.

Figure 4A:
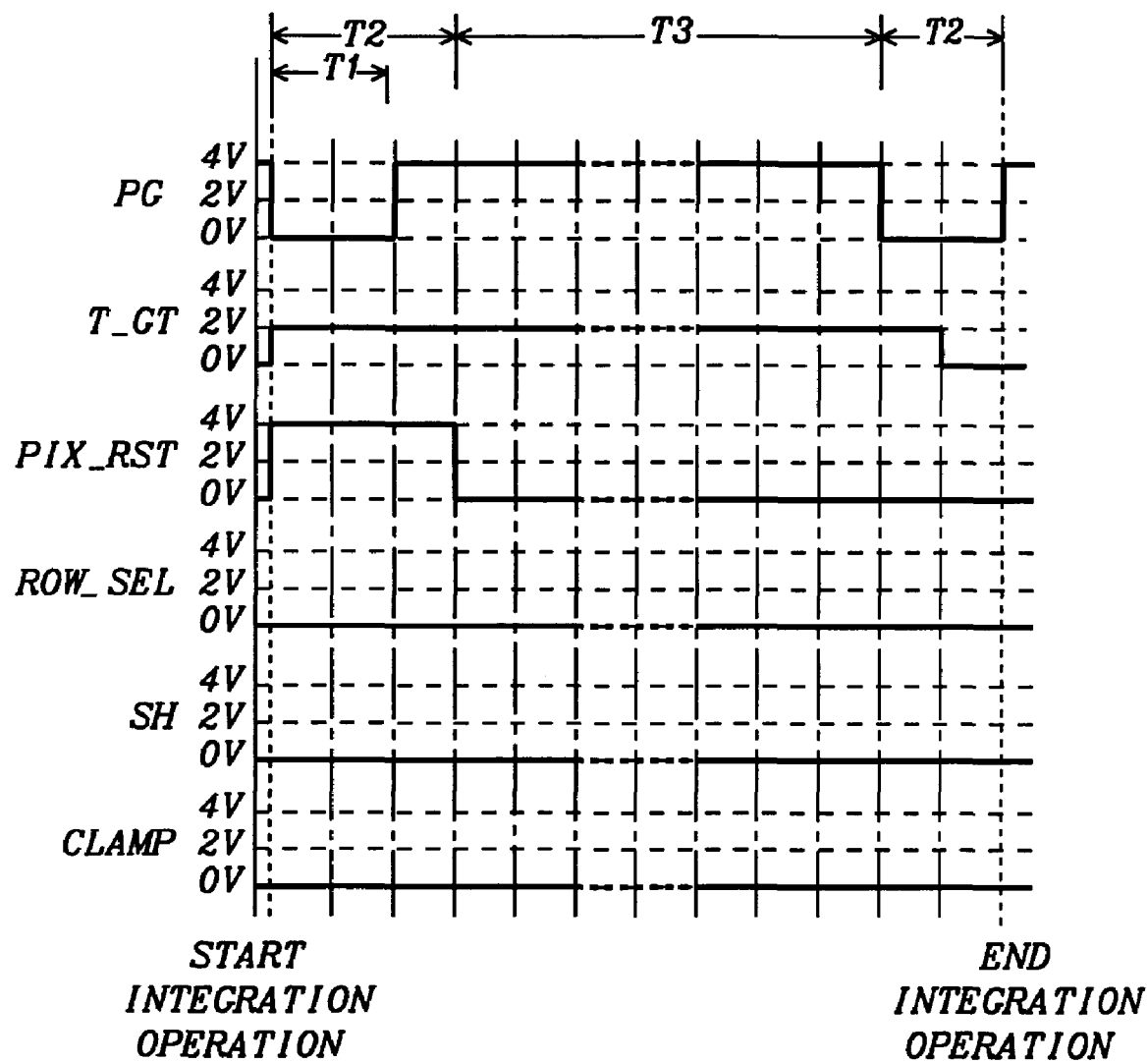
FIGS. 4a and 4b are plots of the control signals of the photo detection, photo conversion, and image readout of a snapshot photogate CMOS active pixel image sensor.
Figure 4B:
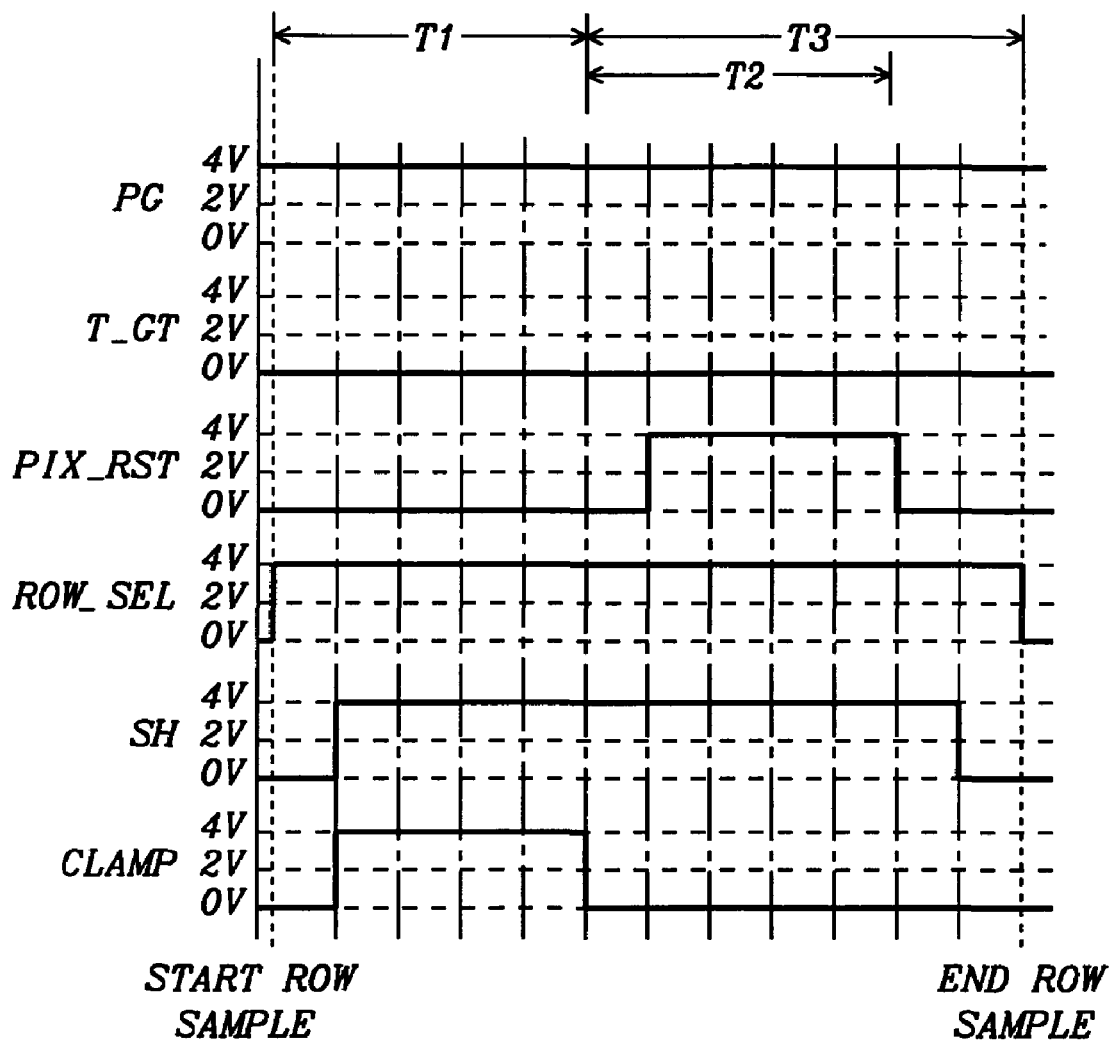

Referring now to FIGS. 3, 4a, and 4b for a discussion of the operation of the snapshot photogate CMOS active pixel image sensors 107 of this invention. During the period time T1 as shown in FIG. 4a, the photogate biasing signal PG 225 is brought to the ground reference voltage level (0V); and the transfer gating signals T_GT 230 is set to the a voltage level sufficient to place the transfer gate switch into deep saturation to remove any residual photoelectrons from the depletion region beneath the photogate 200. During period of time T2, the pixel reset signal PIX_RST 235 is set to the power supply voltage source VDD to activate the reset gate switch to remove any residual photoelectrons from the floating diffusion storage node 205.

At the completion of the period of time T1 and during the period of time T3, the photogate biasing signal PG 225 is activated to provide the integration of the photoelectron created by the impinging of the photons on the photogate 200. The transfer gating signals T_GT 230 is continued to be set to the voltage level to activate the transfer gate switch to allow the photoelectrons to collect in the floating diffusion storage node 205. At the end of the integration time T3, the photogate biasing signal PG 225 is deactivated and the photoelectrons are transferred to the floating diffusion storage node 205. The transfer gating signals T_GT 230 is deactivated during the time T4. At the end of the period of time T4 the integration operation is completed and the row sampling process as shown in FIG. 4b begins.

During the row sampling process time, the photogate biasing signal PG 225 is set to the voltage level of the power supply voltage source VDD and the transfer gating signals T_GT 230 is set to the ground reference voltage level to deactivate the transfer gate switch. The row select gating signal 247 is activated at the beginning of the period of time T1 of the row sampling process time to turn on the CMOS transistor 245 to transfer the pixel output electrical signal PIX_OUT 250 to column pixel bus 255. At a delay period after the row select gating signal 247 is activated, the sample and hold signal SH 267 and the clamp signal 282 are activated to respectively activate the switches SW1 265 and SW2 280 to capture the pixel output electrical signal PIX_OUT 250 indicative of the level of the intensity of the light energy 220. At the end of the first period of time T1 the clamp signal 282 is terminated and the second and third periods of time T2 and T3 are started. At delay time after the start of the second and third periods of time T2 and T3, The pixel reset signal PIX_RST 235 is activated to remove the photoelectrons are removed from the photogate 200 and the floating diffusion storage node 205. At the end of the time period T2 the pixel reset signal PIX_RST 230 is terminated. The pixel output electrical signal PIX_OUT 250 is at the level of the reset value with the photoelectrons removed from the photogate 200 and the floating diffusion storage node 205. The time T3 samples the reset value of the snapshot photogate CMOS active pixel image sensors 107. The output of the column sample and hold circuit 117 is then amplified by the amplifier 120 and converted to the digital data output 127 in the analog-to-digital converter 125.

Figure 6:
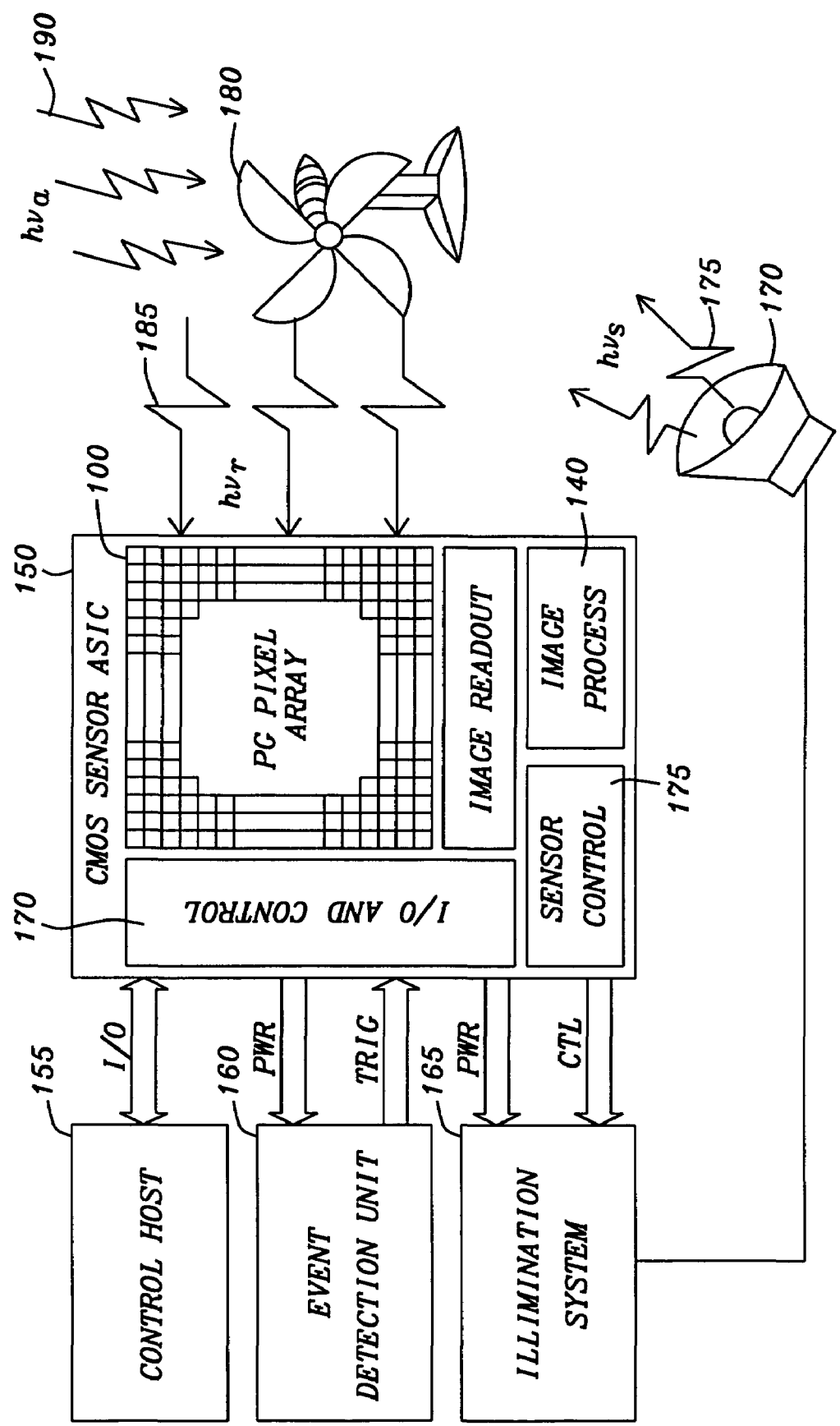
FIG. 6 is block diagram of an object recognition processing system including an image processing application specific integrated circuit of FIG. 2.
Figure 7A:
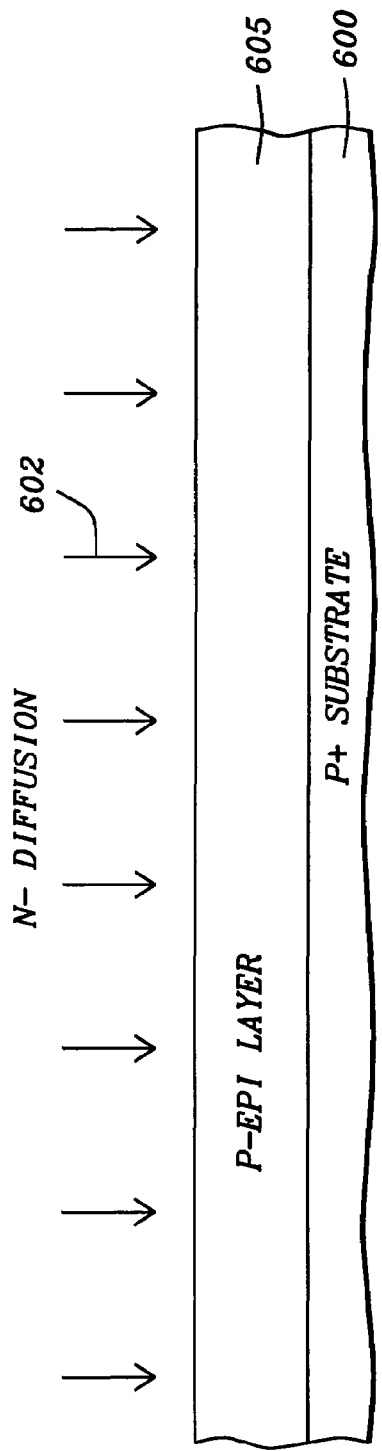
Figure 7B:
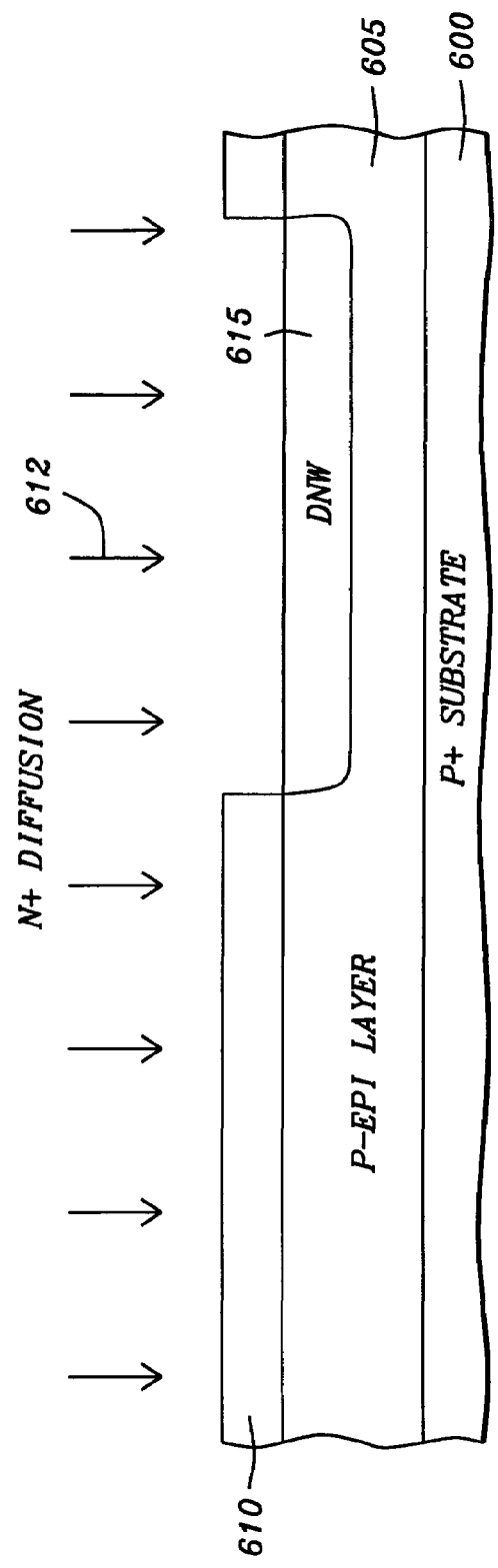
Figure 7C:
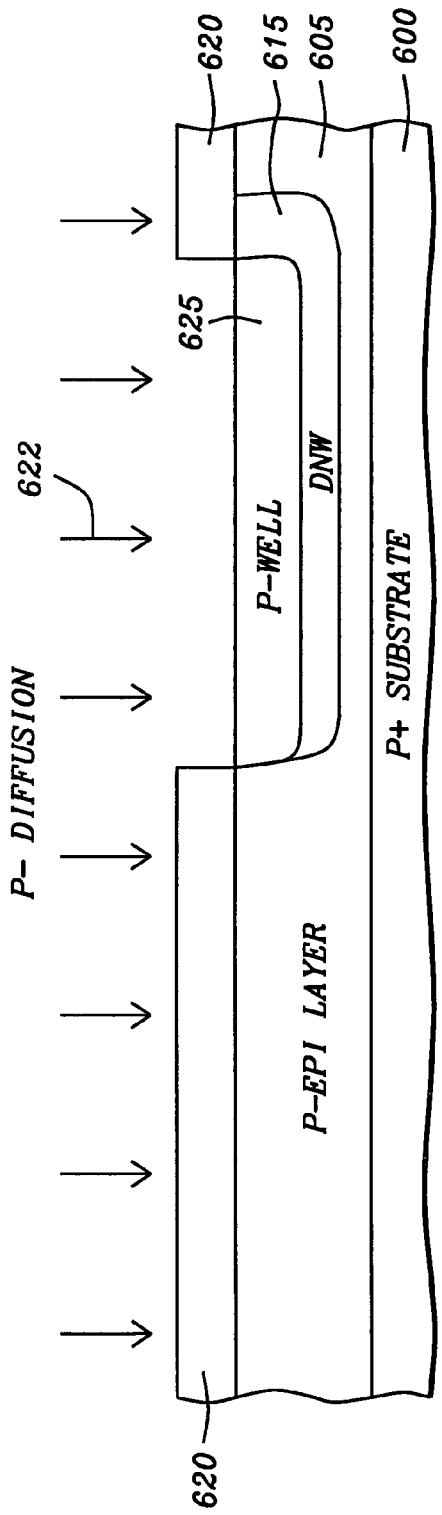
Figure 7D:
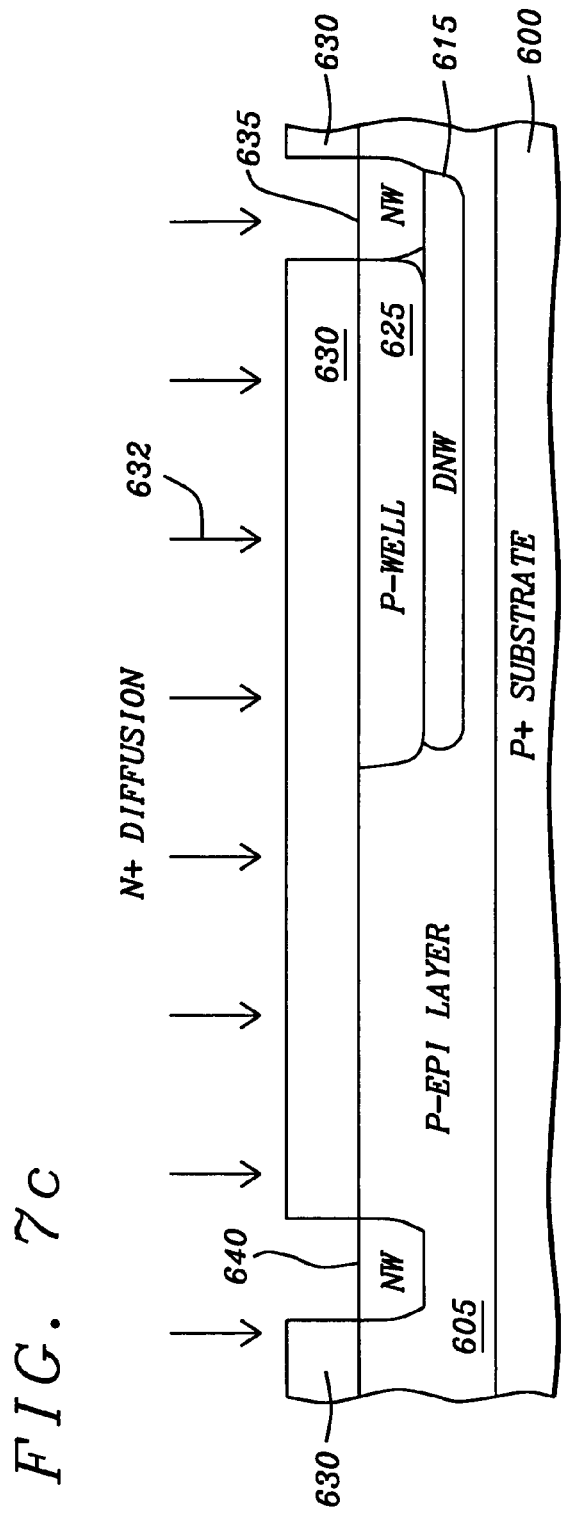
Figure 7G:
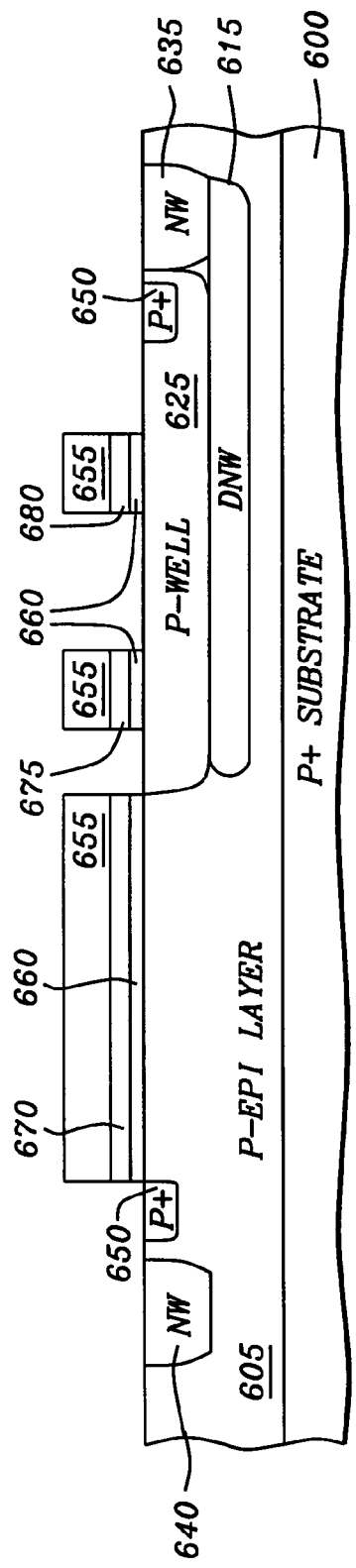
Figure 7H:
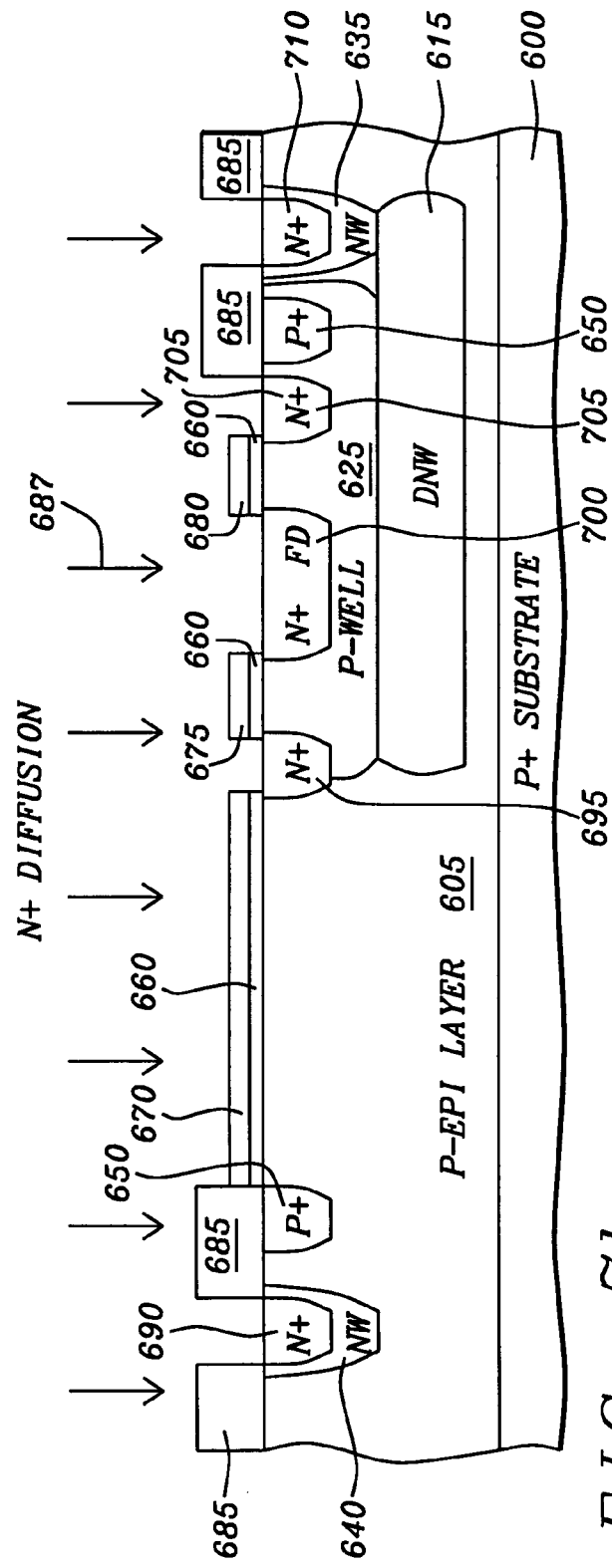
Figure 7I:
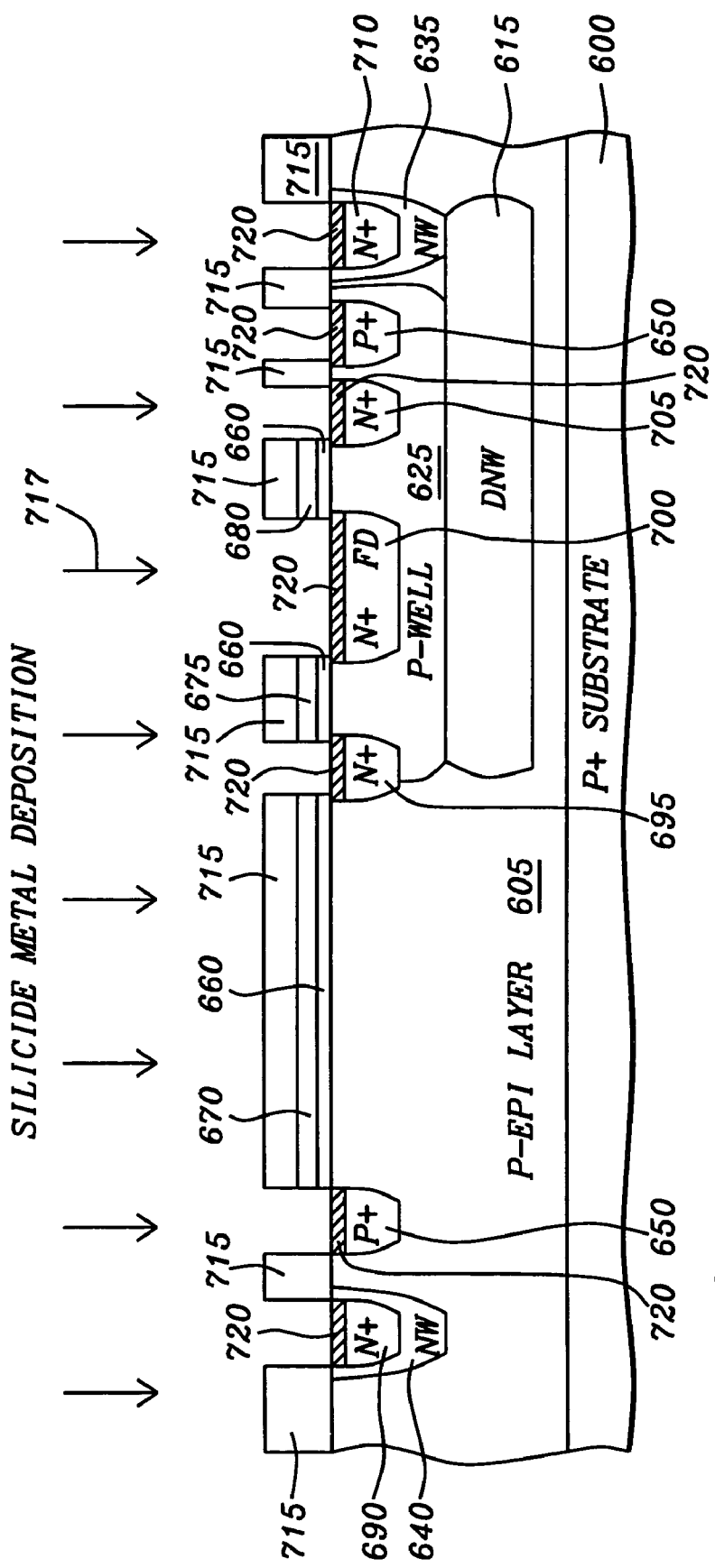
Figure 7J:
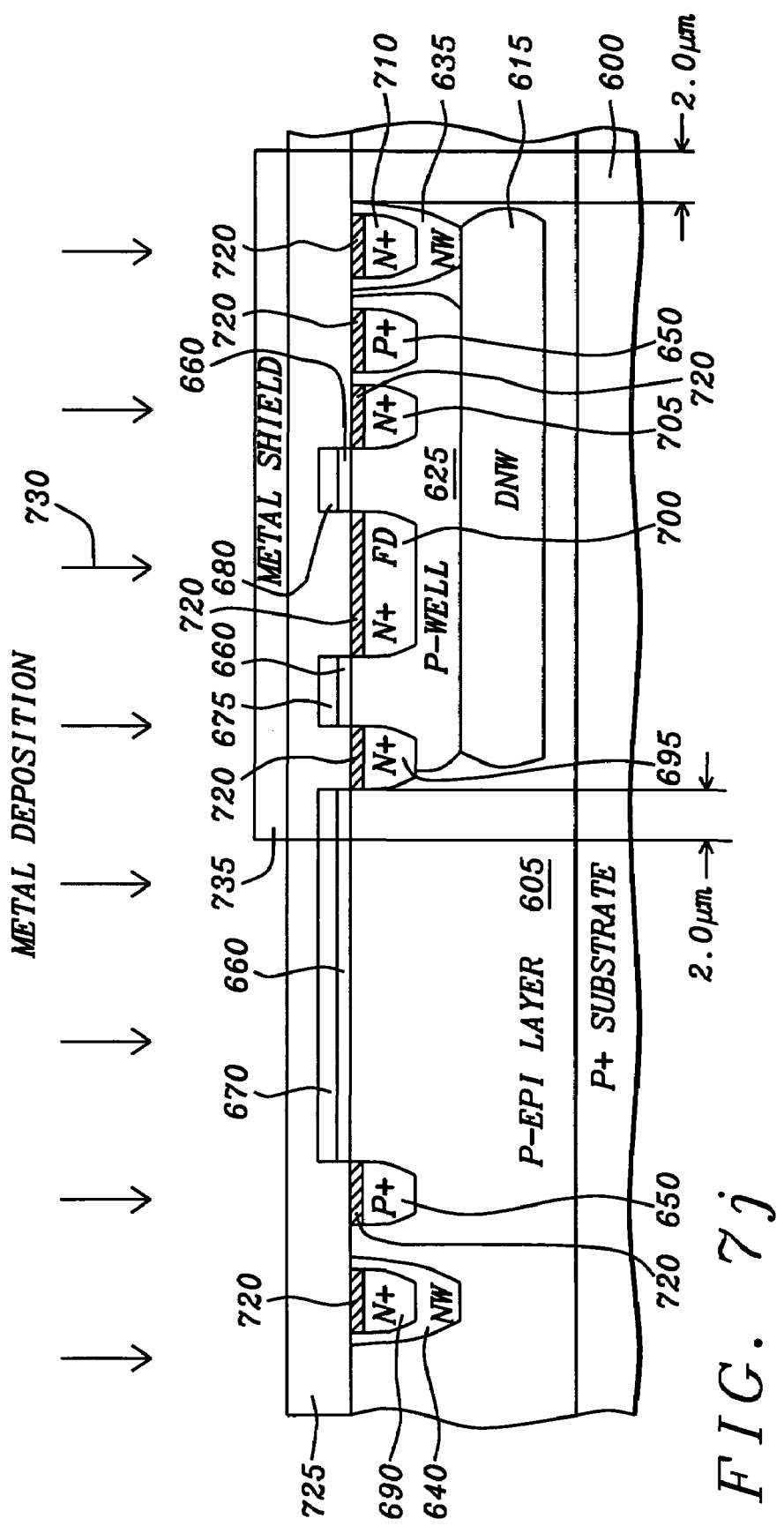

A pattern recognition system using the snapshot photogate CMOS active pixel image sensor of this invention is illustrated in FIG. 6. The pattern recognition system includes the image processing application specific integrated circuit 150, Control host 155, Illumination System 165, and Event Detection Unit 160. As described above the image processing application specific integrated circuit 150 contains a low resolution snapshot photogate pixel image sensor array 100 and on-chip image processing 140. The image processing application specific integrated circuit 150 also contains I/O control 170 with an interface with the control host 155, sensor control 175, illumination control 130 to provide a high voltage level through the illumination system 165 to the light source 175 from the charge pump 135 and switching control to turn the light source 175 on and off.

The snapshot photogate CMOS active pixel image sensors of this invention as described in FIG. 5 have the required high shutter rejection ratio that allows the image sensor to have an exposure time that is chosen to be a very small fraction of the frame rate (readout time). In the preferred embodiment of the pattern recognition system, the exposure time is as small as approximately 20 µsec with a frame rate of approximately 75 frames per second. This allows a readout and processing time of greater than approximately 10 msec.

The image processing application specific integrated circuit 150 generates a synchronization pulse for activation of the illumination source 170. When the illumination source 170 is synchronized with exposure time to provide the source lighting 175 to the moving object 180. The source lighting 175 reflects from the moving object 180 and the reflected light 185 is captured by the snapshot photogate CMOS active pixel image sensor 100. Because of the high shutter rejection ratio, the effective motion freeze of the moving object 180 is independent of the ambient illumination 190. In this particular application, the image processing application specific integrated circuit 150 achieves the same motion freeze whether the target is in dark ambient light 190 or extremely bright ambient light 190. This motion freeze is achieved by using a synchronization pulse from the illumination control 130 of the image processing application specific integrated circuit 150 of FIG. 2. The synchronization pulse controls the synchronization of the exposure time and illumination.

While the moving object 180 is shown as being illuminated by the source lighting 175 and controlled by the illumination control 130, the moving object 180 maybe be illuminated by the ambient light 190. The integration time (exposure time) is controlled by sensor control 175 and the motion freeze is similarly achieved.

If the snapshot photogate CMOS active pixel image sensor of this invention had not had a higher shutter rejection ratio, a higher frame rate would be needed to achieve similar results. Table 1 illustrates the advantage of the snapshot photogate CMOS active pixel image sensor of this invention over the active pixel image sensors of the prior art.

TABLE 1

| Example A) [This invention] | SRR = 94 dB, | Exposure = 200 μsec, | Frame Rate = 100 fps (10 msec) |
| --- | --- | --- | --- |
| Example B) Snapshot pixel | 1% crosstalk (SRR = 40 dB), | Exposure = 200 μsec, | Frame Rate = 2000 fps (500 μsec) |
| Example C) Rolling shutter, | | Exposure = 200 μsec, | Frame Rate = 5000 fps (200 μsec) |

The high shutter rejection ratio as shown permits freeze frame motion equivalent to 5000 frames per second at approximately 100 frames per second without any compromise in quality. This is not possible for snapshot active pixel sensors of the prior art where the cross talk is more than 1%.

Figure 8:
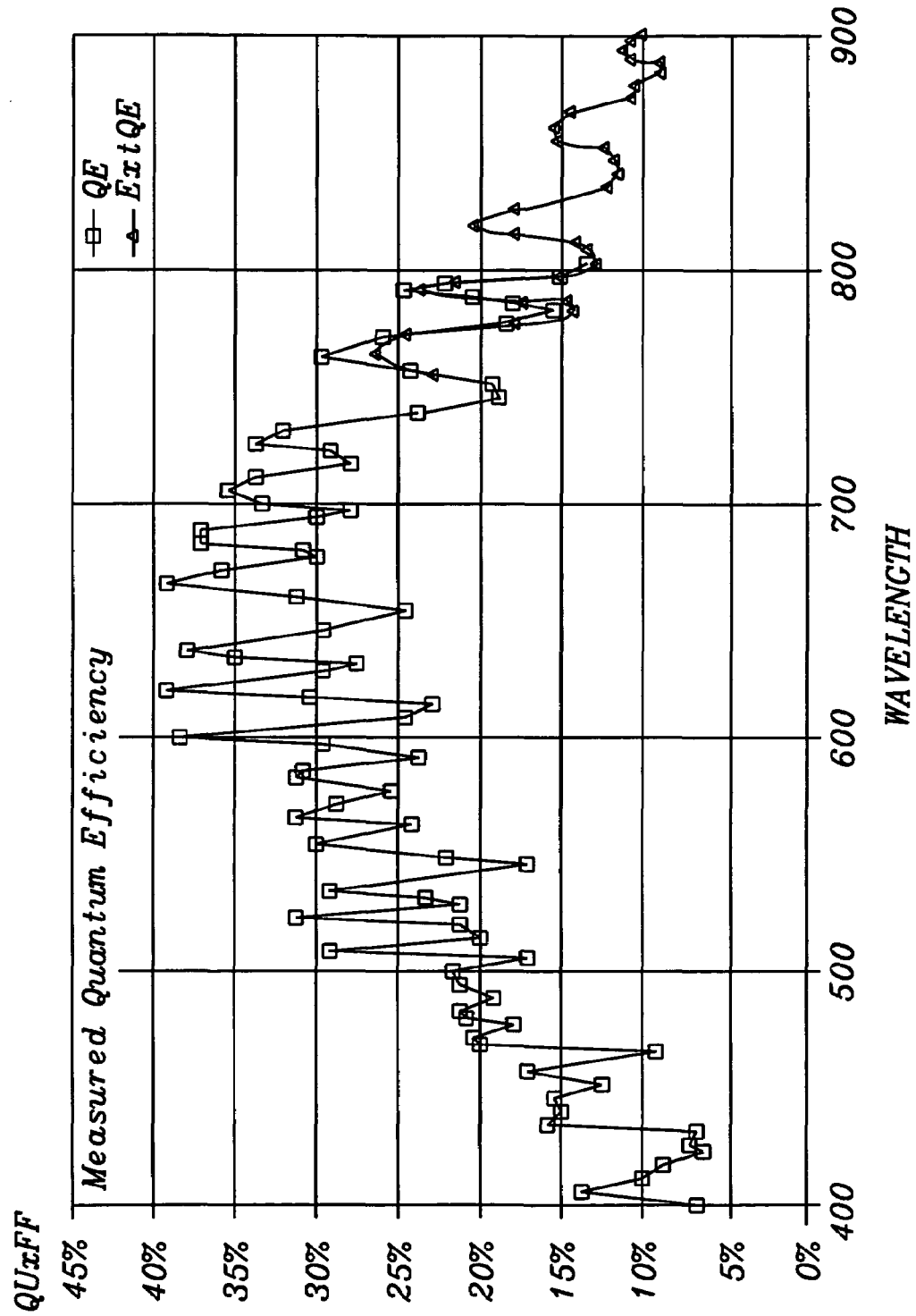
FIG. 8 is a plot of the measured quantum efficiency of the snapshot photogate CMOS active pixel image sensor of this invention.

The basic quality criterion for pixel sensitivity is the product of its Fill Factor and Quantum Efficiency (QE×FF). Quantum Efficiency (QE) denotes the number of photoelectrons effectively generated in the pixel per impinging photon. Photons are lost for conversion due to reflection on dielectrics, lack of absorption in the acquisition layer, and loss of charges and recombination. The Fill Factor is the ratio of effectively light-sensitive pixel area to the total pixel area. The measured quantum efficiency without the fill factor adjustment for the snapshot photogate CMOS active pixel image sensor of this is given in FIG. 8. Note that, QE at the near infrared illumination of interest is defined by the epitaxial layer thickness. The pixel size is chosen to provide adequate signal as required for the pattern recognition system of this invention. The snapshot photogate CMOS active pixel image sensor of this invention has peak QE is about 37% at approximately 650 nm light wavelength. Further, in the pattern recognition system of this invention, it was also desirable to reduce the visible light sensitivity of the pixel which was partially achieved by photo-gate.

Figure 9:
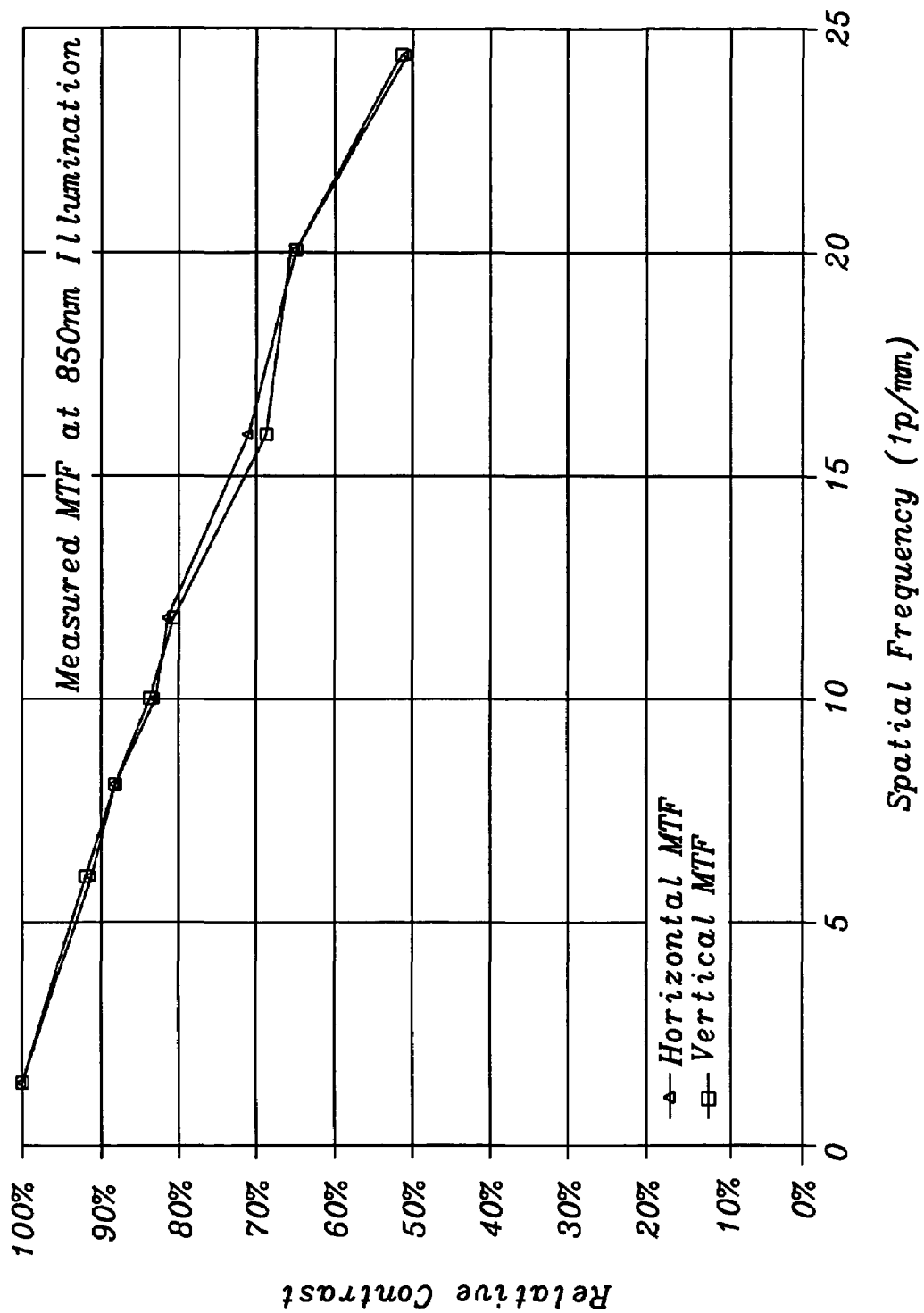
FIG. 9 is a plot of the modulation transfer function (MTF) of the snapshot photogate CMOS active pixel image sensor of this invention.

Modulation Transfer Function (MTF) is the ratio between the amplitudes of a sinusoidal pattern in an optical image and the resulting electronic image. The MTF provides a measure for a sensor's inherent sharpness of focus and is a very important parameter for pattern recognition. To enhance the MTF of the chip, the N-type guard ring 415 of FIG. 5 is implemented in the snapshot photogate active pixel image sensor of this invention. The guard ring 415 of FIG. 5 reduces the crosstalk between adjacent pixels to improve the MTF of the snapshot photogate active pixel image sensor of this invention as illustrated by the plot of the relative contrast to the spatial frequency at 850 nm illumination in FIG. 9.

In the operation of the snapshot photogate active pixel image sensor of this invention, the integration time is much shorter than the readout time. High shutter rejection ration (SRR) is required for getting pictures without motion artifacts. Shutter rejection ratio is given by:

$$SRR = 20 \cdot \log_{10}\left[\frac{(Mean_{ILLUM} / Leak_{ROW})}{(T_{INT} / T_{ROW\_READ})}\right] \text{ (dB)}$$

where:
MeanILLUM is the illumination value wherein the illumination level is set near saturation and close to full analog-to-digital converter output range at the minimum integration time $T_{INT}$ (i.e., $T_{INT}$=20 μsec). The object is illuminated during the integration time only.

$Leak_{ROW}$ is the leakage of the snapshot photogate active pixel image sensor to the sense node during one row readout time. The object is illuminated at the same level during the image during readout operation (i.e., readout time of each row $T_{ROW\_READ}$=80 μsec).

Table 2 gives the measured image SRR at different illumination levels. It should be noted that it is difficult to measure the SRR when the light leakage has been successfully eliminated, as has been the case in the snapshot photogate active pixel image sensor of this invention. The low illumination level corresponds to 100× the saturation signal at 20 μsec integration time. Even at this level of illumination during readout, the slope for the entire frame is less than 0.3 LSB; which is at the theoretical limit of analog-to-digital converter digitization noise. The other two numbers correspond to 200× and 400× saturation level at 20 μsec integration time.

TABLE 2

| Illumination Level (Image Output) | Measured SRR |
| --- | --- |
| 236 (DN) | 96.8 dB |
| 114 (DN) | 97.0 dB |
| 52 (DN) | 96.5 dB |

Refer now to FIGS. 7a-7j for a discussion of a method for forming a pixel image sensor having a high shutter rejection ratio. A heavily doped P-type substrate 600 doped is provided. An N-type impurity 602 is diffused into the surface of the substrate to form an epitaxial layer 605. A photo-mask 610 is applied to the surface of the substrate 600 and the N-type impurity 612 is diffused in an opening of the photo mask 610 into the surface of the substrate 600 to a relative great depth from a surface of the substrate 600 and beneath an area designated to contain a storage node and storage node control transistor switches of the pixel image sensor to form an deep N-well isolation barrier 615. The N-well isolation barrier is biased in operation to a biasing voltage that is approximately the voltage level of the power supply voltage source VDD to prevent substrate charge leakage caused by photoelectrons generated in the substrate beneath a photon sensing area of the pixel image sensor from drifting to the storage node.

A photo mask 620 is placed on the surface of the substrate 600 and a P-type impurity is diffused into an opening in the photo mask 620 into the surface of the substrate 600 to form the P-type isolation well 625. A photo mask 630 is placed on the surface of the substrate 600 and the N-type impurity is diffused into openings in the photo mask 630 into the substrate 600 to form the diffusion well 635 and the guard ring diffusion 640. The diffusion well 635 is diffused into the substrate 600 to a depth less than the relatively great depth but in contact with the deep N-well isolation barrier 615. The guard ring 640 is structured to surround the photo sensing area, the storage node, and the storage node control transistor switches. The guard ring 640 is in contact with the biasing voltage to reduce cross-talk from photoelectrons drifting from adjacent image sensors. Similarly, the deep N-well isolation barrier 615 is connected through the diffusion well 635 to a biasing voltage to channel the photoelectrons away from the storage node.

The photo mask 645 is placed on the surface of the substrate 600 with opening to accept the diffusion 647 of the P-type impurity to a highly doped level to form the P-type contact diffusions 650. The P-type contact diffusions are connected externally to the ground reference voltage level. The photo mask 645 is removed and the photo mask 655 is placed on the surface of the substrate 600. A gate insulation or thin oxide 660 is grown on the surface of the substrate 600. A polycrystalline silicon layer is then grown on the surface of the substrate 600 and doped to with an N-type impurity during deposition to lower its resistance. The polycrystalline silicon is patterned using the photo mask 655 to form the photogate 670, the gate 675 of the transfer gate switch, and the gate 680 of the reset gate switch. The polycrystalline silicon layer and the thin oxide layer 660 is then removed from the surface with the photo mask 655 preventing the removal of the polycrystalline silicon and thin oxide 660 of the photogate 670, the gate 675 of the transfer gate switch, and the gate 680 of the reset gate switch. The photogate 670, the gate 675 of the transfer gate switch, and the gate 680 of the reset gate switch act as self-alignment masking for the formation of the source drains and the floating diffusion of the transfer gate switch and the reset gate switch. The photo mask 685 is applied to the surface of the substrate 600 with openings for contact diffusions 690 and 710 for the diffusion well 635 and the guard ring diffusion 640. The N-type impurity is diffused into the surface of the substrate to form the contact diffusions 690 and 710, the source/drains 695 and 705 of the transfer gate switch and the reset gate switch, and the storage node floating diffusion 700. The photo mask 715 is applied to the surface of the substrate 600 and openings are made for the P-type contact diffusions 650, contact diffusions 690 and 710, the source/drains 695 and 705 of the transfer gate switch and the reset gate switch, and the storage node floating diffusion 700. Silicide metal 717 is deposited on the surface of the substrate in the openings of the photo mask 715 to for the metallic silicide 720.

Appropriate interconnection insulation layers 725 are deposited on the surface of the substrate. The insulation layers 725 are etched to form contact openings for vias. Conductive metals or polycrystalline silicon are formed to the create the necessary interconnections for the snapshot CMOS active pixel image sensor of this invention. These steps of the process are structured as known in the art and are not shown.

The highest layer of metal 730 is deposited on the surface of the substrate 600. A photo mask (not shown) is placed over the area of the substrate that includes the transfer gate switch and the reset gate switch, and the storage node floating diffusion 700. The excess metal is removed and the metal shield 735 is formed over the transfer gate switch and the reset gate switch, and the storage node floating diffusion 700. The metal shield 735 is designed to cover an area that is approximately 2.0 μm greater than the area that includes the transfer gate switch and the reset gate switch, and the storage node floating diffusion 700. The structure of the metal shield prevents light from impinging upon the transfer gate switch and the reset gate switch, and the storage node floating diffusion 700 and causing photoelectrons from collecting in the storage node floating diffusion 700. This increases the shutter rejection ratio of the snapshot photogate CMOS active pixel image sensors of this invention.

While this invention has been particularly shown and described with reference to the preferred embodiments thereof, it will be understood by those skilled in the art that various changes in form and details may be made without departing from the spirit and scope of the invention.

The invention claimed is:

1. A pixel image sensor fabricated on a substrate having a high shutter rejection ratio comprising:

a photon sensing area for receiving photons and converting said photons to photoelectrons;

an isolation barrier placed at a relatively great depth from a surface of said substrate and beneath a storage node and storage node control transistor switches of said pixel image sensor and not beneath said photon sensing area to prevent substrate charge leakage caused by photoelectrons generated in said substrate beneath said photon sensing area of said pixel image sensor from drifting to said storage node; and a diffusion well placed in said surface of said substrate to contact said isolation barrier and connected to a first biasing voltage to channel said photoelectrons away from said storage node.

2. The pixel image sensor of claim 1 further comprising:
   a metal shield fabricated above said storage node and storage node control transistor switches to prevent light from impinging on said storage node and storage node control transistor switches to prevent generation of photoelectrons at said storage node and storage node control transistor switches.

3. The pixel image sensor of claim 1 further comprising:
   a metallic silicide in contact with said storage node and source/drain regions of said storage node control transistor switches, said metallic silicide layer being opaque to prevent light impinging on said storage node and storage node control transistor switches from generation of photoelectrons at said storage node and storage node control transistor switches.

4. The pixel image sensor of claim 1 further comprising:
   a guard ring surrounding said photo sensing area, said storage node, and said storage node control transistor switches and in contact with said first biasing voltage to reduce cross-talk from photoelectrons drifting from adjacent image sensors in an array of pixel image sensor formed on said substrate.

5. The pixel image sensor of claim 4 wherein said first biasing voltage is a power supply voltage source such that said guard ring drains said photoelectrons that drift toward said guard ring.

6. The pixel image sensor of claim 1 wherein said first biasing voltage is a power supply voltage source such that said isolation barrier drains said photoelectrons that drift toward said isolation barrier.

7. The pixel image sensor of claim 1 wherein said pixel image sensor is fabricated in an epitaxial layer of said substrate; and said epitaxial layer being doped with an impurity of a first conductivity type; and said isolation barrier being formed from diffusion of an impurity of a second conductivity type to said relatively great depth.

8. The pixel image sensor of claim 7 further comprising an isolation well fabricated by diffusion of said impurity of said first type to a depth less than said relatively great depth; said storage node and storage node control transistor switches being formed within said isolation well.

9. The pixel image sensor of claim 2 wherein said metal shield extends at least approximately 2.0 μm beyond an area defined by said storage node and storage node control transistor switches.

10. The pixel image sensor of claim 2 where in said metal shield is a highest level wiring layer fabricated on said surface of said substrate, wherein interconnections for said pixel image sensor are placed on lower wiring levels fabricated on said surface of said substrate.

11. A pixel image sensor integrated circuit fabricated on a substrate comprising:

an array of pixel image sensors having a high shutter rejection ratio fabricated on said substrate, each pixel image senor comprising:
a photon sensing area for receiving photons and converting said photons to photoelectrons,
an isolation barrier placed at a relatively great depth from a surface of said substrate and beneath a storage node and storage node control transistor switches of said pixel image sensor, and not beneath said photon sensing area to prevent substrate charge leakage caused by photoelectrons generated in said substrate beneath said photon sensing area of said pixel image sensor from drifting to said storage node, and
a diffusion well placed in said surface of said substrate to contact said isolation barrier and connected to a first biasing voltage to channel said photoelectrons away from said storage node.

12. The pixel image sensor integrated circuit of claim 11 wherein each pixel image sensor further comprises:
a metal shield fabricated above said storage node and storage node control transistor switches to prevent light from impinging on said storage node and storage node control transistor switches to prevent generation of photoelectrons at said storage node and storage node control transistor switches.

13. The pixel image sensor integrated circuit of claim 11 wherein each pixel image sensor further comprises:
a metallic silicide layer in contact with said storage node and source/drain regions of said storage node control transistor switches, said metallic silicide layer being opaque to prevent light impinging on said storage node and storage node control transistor switches from generation of photoelectrons at said storage node and storage node control transistor switches.

14. The pixel image sensor integrated circuit of claim 11 wherein each pixel image sensor further comprises:
a guard ring surrounding said photo sensing area, said storage node, and said storage node control transistor switches and in contact with said first biasing voltage to reduce cross-talk from photoelectrons drifting from adjacent image sensors in an array of pixel image sensor formed on said substrate.

15. The pixel image sensor integrated circuit of claim 14 wherein said first biasing voltage is a power supply voltage source such that said guard ring drains said photoelectrons that drift toward said guard ring.

16. The pixel image sensor integrated circuit of claim 11 wherein said first biasing voltage is a power supply voltage source such that said isolation barrier drains said photoelectrons that drift toward said isolation barrier.

17. The pixel image sensor integrated circuit of claim 11 wherein each of said pixel image sensors is fabricated in an epitaxial layer of said substrate; and said epitaxial layer being doped with an impurity of a first conductivity type; and said isolation barrier being formed from diffusion of an impurity of a second conductivity type to said relatively great depth.

18. The pixel image sensor integrated circuit of claim 17 wherein each pixel image sensor further comprises a isolation well fabricated by diffusion of said impurity of said first type to a depth less than said relatively great depth; said storage node and storage node control transistor switches being formed within said isolation well.

19. The pixel image sensor integrated circuit of claim 12 wherein said metal shield extends at least approximately 2.0 μm beyond an area defined by said storage node and storage node control transistor switches.

20. The pixel image sensor integrated circuit of claim 12 where in said metal shield is a highest level wiring layer fabricated on said surface of said substrate, wherein interconnections for said pixel image sensor are placed on lower wiring levels fabricated on said surface of said substrate.

21. A pattern recognition system for detecting moving objects without motion artifacts comprising:
a pixel image sensor integrated circuit fabricated on a substrate comprising:
an array of pixel image sensors having a high shutter rejection ratio fabricated on said substrate, each pixel image senor comprising:
a photon sensing area for receiving photons and converting said photons to photoelectrons,
an isolation barrier placed at a relatively great depth from a surface of said substrate and beneath a storage node and storage node control transistor switches of said pixel image sensor and not beneath said photon sensing area to prevent substrate charge leakage caused by photoelectrons generated in said substrate beneath said photon sensing area of said pixel image sensor from drifting to said storage node, and
a diffusion well placed in said surface of said substrate to contact said isolation barrier and connected to a first biasing voltage to channel said photoelectrons away from said storage node.

22. The pattern recognition system of claim 21 wherein each pixel image sensor further comprises:
a metal shield fabricated above said storage node and storage node control transistor switches to prevent light from impinging on said storage node and storage node control transistor switches to prevent generation of photoelectrons at said storage node and storage node control transistor switches.

23. The pattern recognition system of claim 21 wherein each pixel image sensor further comprises:
a metallic silicide layer in contact with said storage node and source/drain regions of said storage node control transistor switches, said metallic silicide layer being opaque to prevent light impinging on said storage node and storage node control transistor switches from generation of photoelectrons at said storage node and storage node control transistor switches.

24. The pattern recognition system of claim 21 wherein each pixel image sensor further comprises:
a guard ring surrounding said photo sensing area, said storage node, and said storage node control transistor switches and in contact with said first biasing voltage to reduce cross-talk from photoelectrons drifting from adjacent image sensors in an array of pixel image sensor formed on said substrate.

25. The pattern recognition system of claim 24 wherein said first biasing voltage is a power supply voltage source such that said guard ring drains said photoelectrons that drift toward said guard ring.

26. The pattern recognition system of claim 21 wherein said first biasing voltage is a power supply voltage source such that said isolation barrier drains said photoelectrons that drift toward said isolation barrier.

27. The pattern recognition system of claim 21 wherein each of said pixel image sensors is fabricated in an epitaxial layer of said substrate; and said epitaxial layer being doped with an impurity of a first conductivity type; and said isolation barrier being formed from diffusion of an impurity of a second conductivity type to said relatively great depth.

28. The pattern recognition system of claim 27 wherein each pixel image sensor further comprises a isolation well fabricated by diffusion of said impurity of said first type to a depth less than said relatively great depth; said storage node and storage node control transistor switches being formed within said isolation well.

29. The pattern recognition system of claim 22 wherein said metal shield extends at least approximately 2.0 μm beyond an area defined by said storage node and storage node control transistor switches.

30. The pattern recognition system of claim 22 where in said metal shield is a highest level wiring layer fabricated on said surface of said substrate, wherein interconnections for said pixel image sensor are placed on lower wiring levels fabricated on said surface of said substrate.

31. A method for forming a pixel image sensor having a high shutter rejection ratio comprising the steps of:
  providing a substrate doped with an impurity of the first conductivity type;
  growing a lightly doped epitaxial layer of said first conductivity type onto a surface of said substrate;
  forming a photon sensing area for receiving photons and converting said photons to photoelectrons;
  forming an isolation barrier at a relatively great depth from a surface of said substrate and beneath a storage node and storage node control transistor switches of said pixel image sensor and not beneath said photon sensing area to prevent substrate charge leakage caused by photoelectrons generated in said substrate beneath said photon sensing area of said pixel image sensor from drifting to said storage node;
  forming a diffusion well placed in said surface of said substrate to contact said isolation barrier; and
  connecting said diffusion well to a first biasing voltage to channel said photoelectrons away from said storage node.

32. The method for forming said pixel image sensor of claim 31 further comprising the steps of:
  fabricating a metal shield above said storage node and storage node control transistor switches to prevent light from impinging on said storage node and storage node control transistor switches to prevent generation of photoelectrons at said storage node and storage node control transistor switches.

33. The method for forming said pixel image sensor of claim 31 further comprising the steps of:
  depositing a metallic silicide layer in contact with said storage node and source/drain regions of said storage node control transistor switches, said metallic silicide layer being opaque to prevent light impinging on said storage node and storage node control transistor switches from generation of photoelectrons at said storage node and storage node control transistor switches.

34. The method for forming said pixel image sensor of claim 31 further comprising the steps of:
  forming a guard ring surrounding said photo sensing area, said storage node, and said storage node control transistor switches; and
  connecting said guard ring with said first biasing voltage to reduce cross-talk from photoelectrons drifting from adjacent image sensors in an array of method for forming said pixel image sensor formed on said substrate.

35. The method for forming said pixel image sensor of claim 34 wherein said first biasing voltage is a power supply voltage source such that said guard ring drains said photoelectrons that drift toward said guard ring.

36. The method for forming said pixel image sensor of claim 31 wherein said first biasing voltage is a power supply voltage source such that said isolation barrier drains said photoelectrons that drift toward said isolation barrier.

37. The method for forming said pixel image sensor of claim 31 wherein the step of forming said isolation barrier comprises the step of:
  diffusing an impurity of a second conductivity type into said surface of said substrate within said epitaxial layer to said relatively great depth.

38. The method for forming said pixel image sensor of claim 37 further comprises the step of:
  forming an isolation well by step of:
    diffusing of said impurity of said first type to a depth less than said relatively great depth over said isolation barrier.

39. The method for forming said pixel image sensor of claim 34 further comprising the step of:
  forming said storage node and storage node control transistor switches within said isolation well.

40. The method for forming said pixel image sensor of claim 32 wherein fabricating said metal shield comprises the step of:
  extending said metal shield at least approximately 2.0 μm beyond an area defined by said storage node and storage node control transistor switches.

41. The method for forming said pixel image sensor of claim 32 where in fabricating said metal shield comprises the step of depositing and selectively removing a metal layer to form said metal shield at a highest level wiring layer that is fabricated on said surface of said substrate, wherein interconnections for said method for forming said pixel image sensor are placed on lower wiring levels fabricated on said surface of said substrate.

* * * * *